US012159830B2

(12) United States Patent
Lee et al.

(10) Patent No.: US 12,159,830 B2
(45) Date of Patent: Dec. 3, 2024

(54) NITROGEN PLASMA TREATMENT FOR IMPROVING INTERFACE BETWEEN ETCH STOP LAYER AND COPPER INTERCONNECT

(71) Applicant: Taiwan Semiconductor Manufacturing Co., Ltd., Hsin-Chu (TW)

(72) Inventors: Hui Lee, Hsinchu (TW); Po-Hsiang Huang, Taipei (TW); Wen-Sheh Huang, Hsin Chu (TW); Jen Hung Wang, Hsinchu County (TW); Su-Jen Sung, Hsinchu County (TW); Chih-Chien Chi, Hsinchu (TW); Pei-Hsuan Lee, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/068,615

(22) Filed: Dec. 20, 2022

(65) Prior Publication Data

US 2023/0121958 A1 Apr. 20, 2023

Related U.S. Application Data

(63) Continuation of application No. 17/070,597, filed on Oct. 14, 2020, now Pat. No. 11,532,548.
(Continued)

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76826* (2013.01); *H01L 21/76829* (2013.01); *H01L 21/76877* (2013.01); *H01L 23/53238* (2013.01)

(58) Field of Classification Search
CPC .......... H01L 23/5226; H01L 21/76826; H01L 21/76829; H01L 21/76877;
(Continued)

(56) References Cited

U.S. PATENT DOCUMENTS 6,436,819 B1 * 8/2002 Zhang ............... H01L 21/76862
438/681
6,962,873 B1 11/2005 Park
(Continued)

FOREIGN PATENT DOCUMENTS

CN 104600123 A 6/2015
CN 105529321 A 4/2016
(Continued)

*Primary Examiner* — Karen Kusumakar
(74) *Attorney, Agent, or Firm* — HAYNES AND BOONE, LLP

(57) ABSTRACT

Interconnect structures exhibiting reduced accumulation of copper vacancies along interfaces between contact etch stop layers (CESLs) and interconnects, along with methods for fabrication, are disclosed herein. A method includes forming a copper interconnect in a dielectric layer and depositing a metal nitride CESL over the copper interconnect and the dielectric layer. An interface between the metal nitride CESL and the copper interconnect has a first surface nitrogen concentration, a first nitrogen concentration and/or a first number of nitrogen-nitrogen bonds. A nitrogen plasma treatment is performed to modify the interface between the metal nitride CESL and the copper interconnect. The nitrogen plasma treatment increases the first surface nitrogen concentration to a second surface nitrogen concentration, the first nitrogen concentration to a second nitrogen concentra-
(Continued)

tion, and/or the first number of nitrogen-nitrogen bonds to a second number of nitrogen-nitrogen bonds, each of which minimizes accumulation of copper vacancies at the interface.

20 Claims, 9 Drawing Sheets

Related U.S. Application Data

(60) Provisional application No. 62/978,561, filed on Feb. 19, 2020.

(58) Field of Classification Search
CPC ......... H01L 23/53238; H01L 21/76832; H01L 21/76834; H01L 21/76843; H01L 21/76849; H01L 23/53295; H01L 23/528; H01L 23/5329; H01L 2221/1052; H01L 21/76883; H01L 21/02167; H01L 21/02178; H01L 21/76846; H01L 23/522
See application file for complete search history.

(56) References Cited

U.S. PATENT DOCUMENTS

| | | | |
|---|---|---|---|
| 7,022,602 B2 | 4/2006 | Ruelke et al. | |
| 7,368,379 B2 | 5/2008 | Tsao et al. | |
| 9,209,079 B2 | 12/2015 | Chi et al. | |
| 9,437,484 B2 * | 9/2016 | JangJian | H01L 21/76877 |
| 9,443,804 B2 | 9/2016 | Shroff et al. | |
| 9,646,876 B2 | 5/2017 | Padhi et al. | |
| 10,249,577 B2 | 4/2019 | Lee et al. | |
| 10,529,663 B1 | 1/2020 | Nogami et al. | |
| 2008/0197500 A1 * | 8/2008 | Yang | H01L 23/53223 |
| | | | 257/E23.141 |
| 2010/0252930 A1 | 10/2010 | Liao et al. | |
| 2016/0372603 A1 | 12/2016 | Liu et al. | |
| 2019/0043804 A1 | 2/2019 | Qian et al. | |
| 2019/0164822 A1 | 5/2019 | Chou et al. | |
| 2019/0273147 A1 | 9/2019 | Cheng et al. | |
| 2019/0393235 A1 | 12/2019 | Teng et al. | |
| 2020/0006641 A1 | 1/2020 | Liou et al. | |
| 2021/0217661 A1 | 6/2021 | Clevenger et al. | |

FOREIGN PATENT DOCUMENTS

| | | |
|---|---|---|
| CN | 109326635 A | 2/2019 |
| CN | 109801873 A | 5/2019 |
| CN | 110634877 A | 12/2019 |
| KR | 20160045550 A | 4/2016 |
| KR | 20190013227 A | 2/2019 |

* cited by examiner

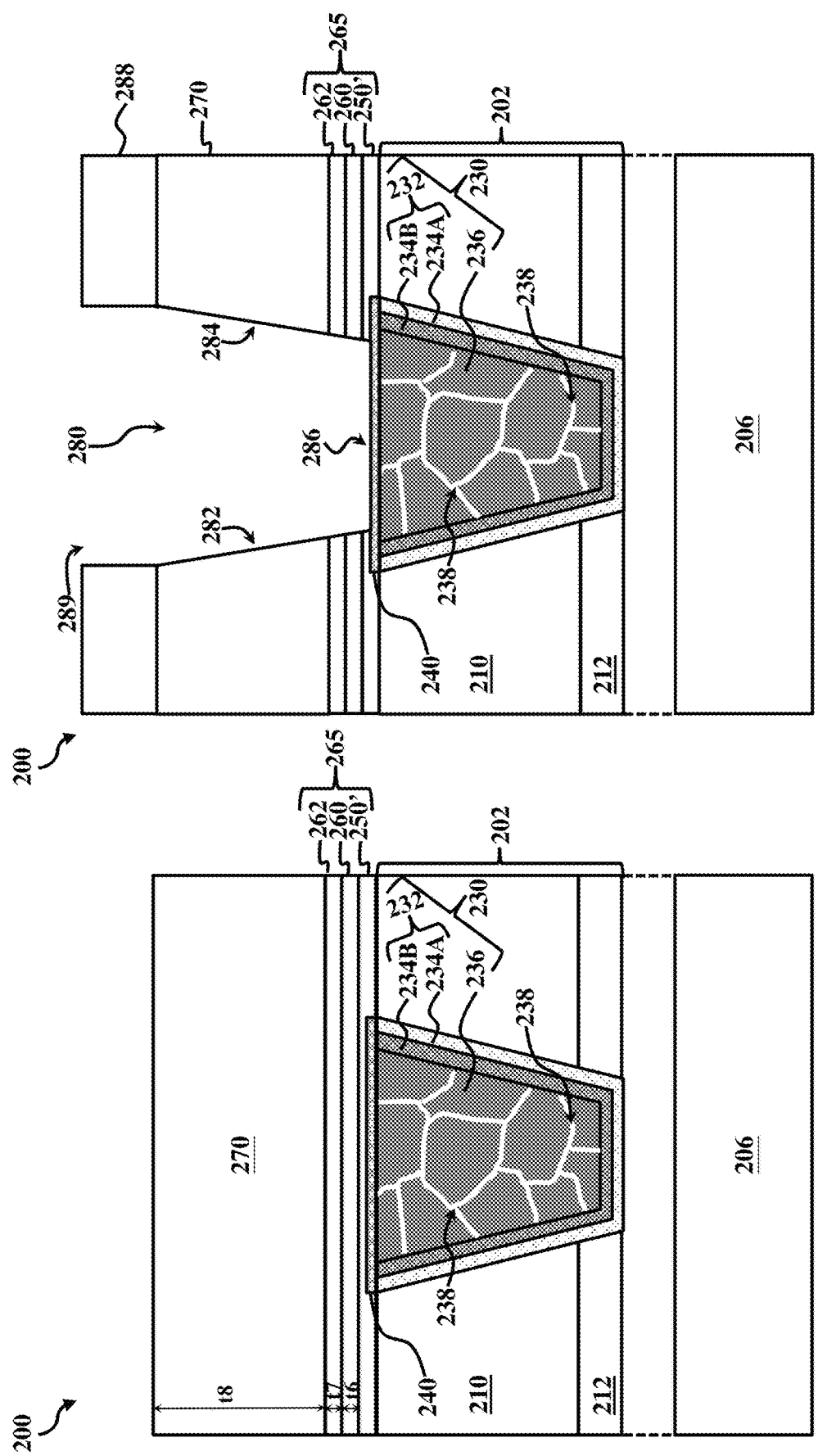

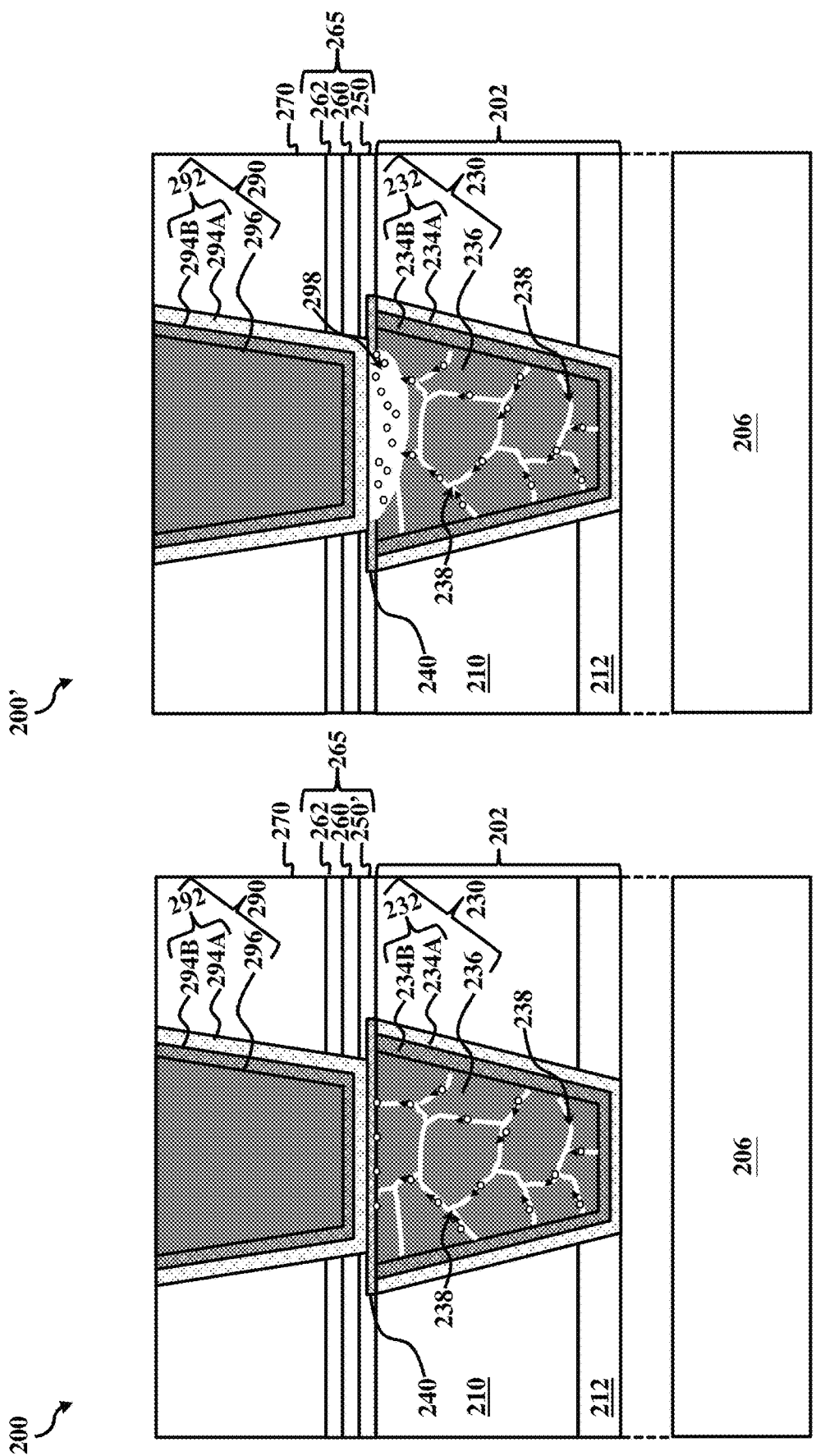

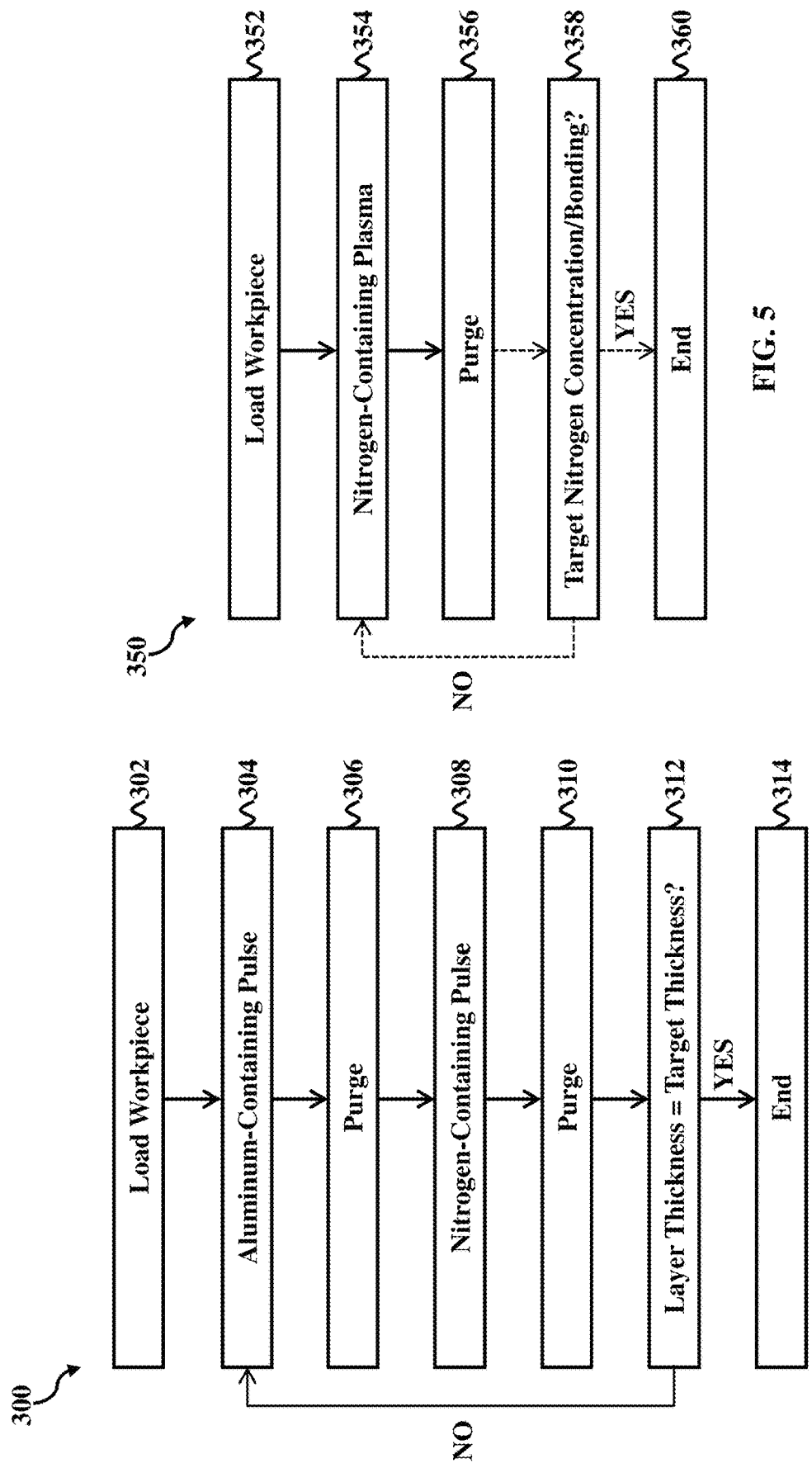

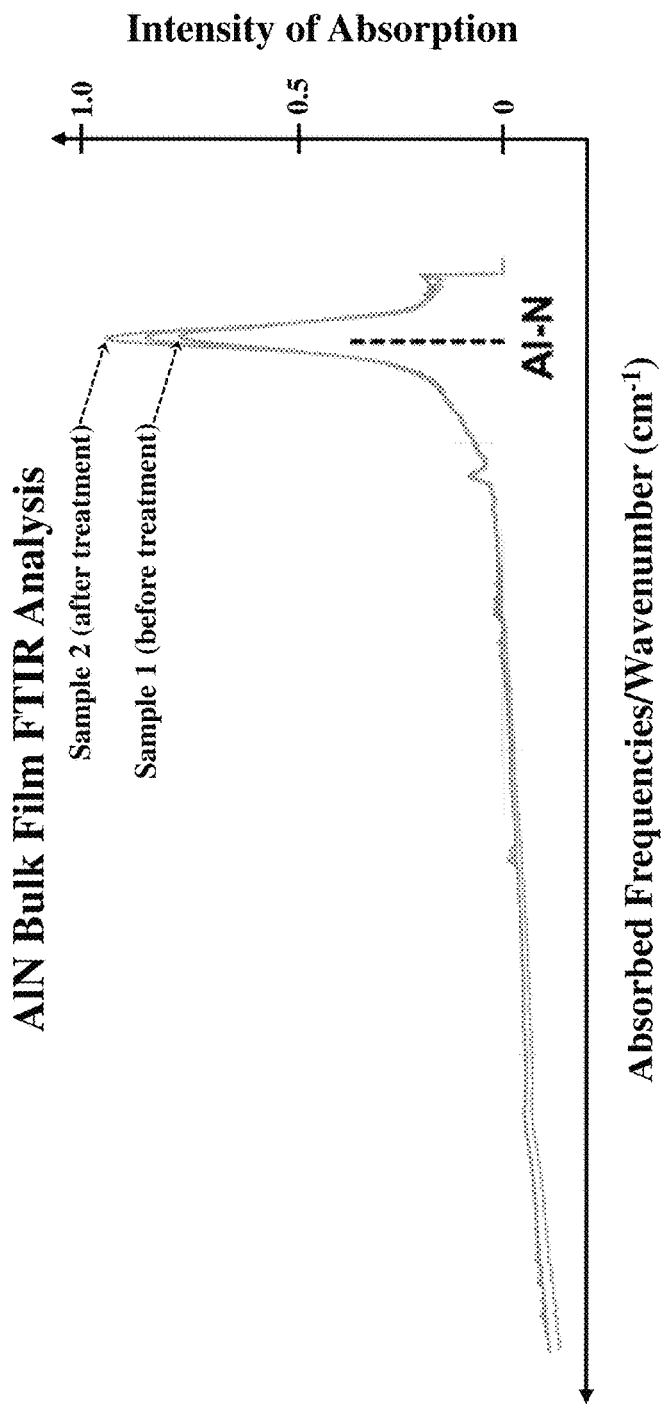
FIG. 6
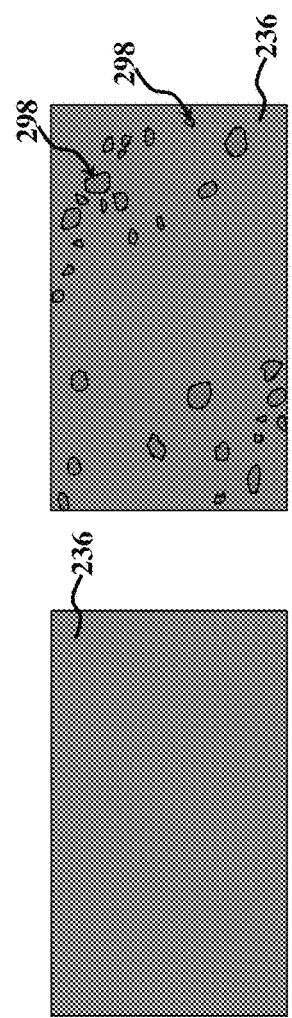
FIG. 7A
FIG. 7B

NITROGEN PLASMA TREATMENT FOR IMPROVING INTERFACE BETWEEN ETCH STOP LAYER AND COPPER INTERCONNECT

The present application is a continuation application of U.S. patent application Ser. No. 17/070,597, filed Oct. 14, 2020, which is a non-provisional application of and claims benefit of U.S. Provisional Patent Application Ser. No. 62/978,561, filed Feb. 19, 2020, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes. However, resistance-capacitance (RC) delay has arisen as a significant challenge as reduced geometry sizes are implemented to achieve ICs with faster operating speeds (e.g., by reducing distances traveled by electrical signals), thereby negating some of the advantages achieved by scaling down and limiting further scaling down of ICs. RC delay generally indicates delay in electrical signal speed through an IC resulting from a product of resistance (R) (i.e., a material's opposition to flow of electrical current) and capacitance (C) (i.e., a material's ability to store electrical charge). Reducing both resistance and capacitance is thus desired to reduce RC delay and optimize performance of scaled down ICs. Interconnects of ICs, which physically and/or electrically connect IC components and/or IC features of the ICs, are particularly problematic in their contributions to RC delay. Solutions for interconnects that have been observed to reduce interconnect contributions to RC delay have introduced new challenges. For example, improved interconnect structures sometimes fail to sufficiently prevent metal diffusion from interconnects into surrounding dielectric materials, which has led to undesirable void formation in the interconnects that degrades IC performance. A need thus exists for improvements in interconnects of ICs and/or methods of fabricating the interconnects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2I are fragmentary diagrammatic views of a portion of a multi-layer interconnect feature at various fabrication stages, such as those associated with the method of FIG. 1, according to various aspects of the present disclosure.

FIG. 3 is a fragmentary diagrammatic view of a portion of a multi-layer interconnect feature according to various aspects of the present disclosure.

FIG. 4 is a flow chart of a deposition process for forming an etch stop layer of a multi-layer interconnect structure according to various aspects of the present disclosure.

FIG. 5 is a flow chart of a nitrogen plasma treatment process for an interface region between an etch stop layer and an interconnect of a multi-layer interconnect structure according to various aspects of the present disclosure.

FIG. 6 is a Fourier Transform Infrared (FTIR) spectra obtained by performing FTIR spectroscopy on an AlN bulk film before and after a nitrogen plasma treatment according to various aspects of the present disclosure.

FIG. 7A and FIG. 7B are fragmentary diagrammatic top views of the portions of the multi-layer interconnect features of FIG. 2I and FIG. 3, respectively, in portion or entirety, according to various aspects of the present disclosure.

DETAILED DESCRIPTION

Figure 1:
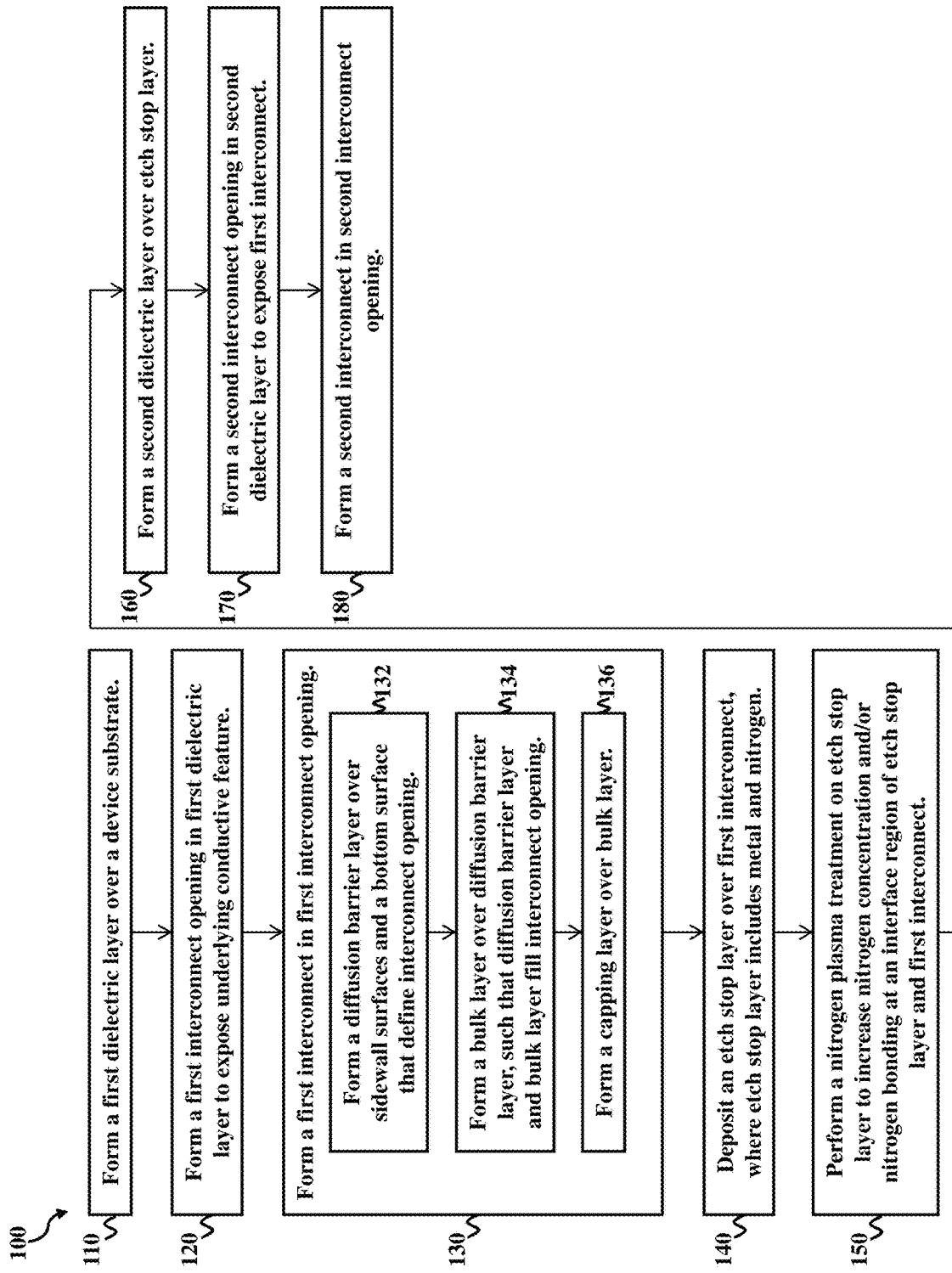
FIG. 1 is a flow chart of a method for fabricating a portion of a multi-layer interconnect feature according to various aspects of the present disclosure.

The present disclosure relates generally to integrated circuit (IC) devices, and more particularly, to interconnect structures for IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Typically, scaling down has been limited only by an ability to lithographically define IC features at ever-decreasing geometry sizes. However, resistance-capacitance (RC) delay has arisen as a significant challenge as reduced geometry sizes are implemented to achieve ICs with faster operating speeds (for example, by reducing distances traveled by electrical signals), thereby negating some of the advantages achieved by scaling down and limiting further scaling. For example, as IC technology nodes expand into 20 nm and below, shrinking critical dimensions (CDs) at IC device layers (for example, gate lengths, gate pitches, fin pitches, etc.) have led to corresponding shrinking in interconnect CDs (for example, device-level contact dimensions, via dimensions, metal line dimensions, device-level contact pitches, via pitches, metal line pitches, etc.) of multi-layer interconnect (MLI) features of the ICs. Shrinking interconnects are becoming increasingly problematic when considering their contribution to RC delay. Solutions for reducing both resistance and capacitance associated with interconnects are thus desired to reduce RC delay and optimize performance of scaled down ICs.

RC delay generally indicates delay in electrical signal speed through an IC resulting from a product of resistance (R), a material's opposition to flow of electrical current, and capacitance (C), a material's ability to store electrical charge. For any two adjacent interconnects, capacitance is a function of a dielectric constant of dielectric material surrounding the two interconnects and a distance between the interconnects. Since decreased distances (spacing) between interconnects results from scaling down ICs (and thus results in increased capacitance), capacitance reduction techniques have focused on reducing a dielectric constant of insulating material of the interconnects. For example, low-k dielectric materials, such as dielectric materials having dielectric constants less than silicon oxide (for example, $SiO_2$), have been developed that reduce parasitic capacitance and/or capacitive coupling between interconnects and adjacent conductive features, such as adjacent interconnects or adjacent device features (for example, gates). Reducing resistance associated with interconnects has been achieved by implementing interconnect materials and/or interconnect configurations that exhibit decreased resistance and facilitate increased electrical current flow. For example, since copper interconnects exhibit lower electrical resistance, higher conductivity, and higher resistivity to electromigration than aluminum interconnects, aluminum interconnects are often replaced with copper interconnects to reduce RC delay and thereby increase IC speed. However, because copper ions/atoms of copper interconnects diffuse easily into low-k dielectric material (which have been implemented to reduce capacitance), diffusion/barrier layers are often integrated in copper interconnects to separate copper layers of the copper interconnects from surrounding low-k dielectric material and reduce (or prevent) diffusion of copper atoms/ions from the copper layers into the surrounding low-k dielectric material.

Undesirable copper diffusion has also been observed at interfaces between copper interconnects and overlying layers during processing, such as contact etch stop layers (CESLs). CESLs are often implemented in copper interconnect fabrication to prevent unintentional etching and/or over-etching of an underlying interconnect. As a result, interconnect fabrication may include a two-step etch process to form an interconnect opening, such as a first etch process that etches a dielectric layer until reaching a CESL formed between the dielectric layer and the underlying interconnect (in other words, the CESL acts as a stop feature for the first etch process) and a second etch process that etches the CESL until reaching (exposing) the underlying interconnect, where parameters of the first etch process are tuned to selectively etch the dielectric layer (for example, relative to the CESL) and parameters of the second etch process are tuned to selectively remove the CESL (for example, relative to the dielectric layer and the underlying interconnect). The interconnect opening is then filled with one or more conductive materials, such as a copper bulk layer disposed over a diffusion barrier layer (including, for example, tantalum and nitrogen) to form a copper interconnect to the underlying interconnect.

Stress-induced voiding (also referred to as stress migration) at an interface between the CESL and the copper interconnect (referred to hereafter as a CESL/copper interface) has become a major factor in IC device reliability. For example, mechanical stresses in an MLI feature can cause copper ions/atoms and copper vacancies to migrate along grain boundaries in the copper interconnect to the CESL/copper interface. As the copper atoms/ions diffuse into the MLI feature (for example, into the CESL and/or surrounding dielectric layers) and the copper vacancies accumulate at the CESL/copper interface, voids form at the CESL/copper interface, which increases resistance of the copper interconnect and degrades IC performance. These voids can cause an open circuit depending on location and/or size, and in some instances, lead to copper interconnect failure and/or IC device failure. These mechanical stresses often arise during MLI feature fabrication (referred to as back-end-of-line (BEOL) processing) because of thermal expansion coefficient mismatches between the copper interconnect and its surrounding dielectric materials. For example, because the copper interconnect and surrounding dielectric materials have different thermal expansion coefficients, the copper interconnect and the surrounding dielectric materials will expand and contract at different rates during various BEOL thermal cycles, causing stress differences in the MLI feature that cause the copper ions/atoms and/or copper vacancies to migrate to the CESL/copper interface.

To address these challenges, the present disclosure proposes interconnect fabrication methods for suppressing copper diffusion at the CESL/copper interface, thereby preventing copper vacancies from accumulating at the CESL/copper interface and reducing (and even eliminating) void formation in the copper interconnect at the CESL/copper interface. For example, the present disclosure proposes performing a nitrogen plasma treatment on the CESL before forming an overlying ILD layer, where the nitrogen plasma treatment is configured to increase a concentration of nitrogen and/or increase and/or enhance (strengthen) nitrogen bonding at the CESL/copper interface. Increasing nitrogen concentration and/or nitrogen bonding at the CESL/copper interface prevents (or limits) diffusion of copper ions/atoms and reduces copper vacancies along the CESL/copper interface, thereby preventing accumulation of copper vacancies at the CESL/copper interface and limiting stress-induced void formation in copper interconnects. The proposed nitrogen plasma treatment has been observed to not only increase a nitrogen concentration of the CESL but also increase a dielectric constant, reflective index, and/or density of the CESL, in some embodiments. Methods for fabricating interconnect structures that include the proposed nitrogen plasma treatment process, along with interconnect structures resulting therefrom, are described in detail below. Different embodiments may have different advantages, and no particular advantage is required of any embodiment.

Turning to FIG. 1, FIG. 1 is a flow chart of a method 100 for fabricating a portion of an MLI feature according to various aspects of the present disclosure. At block 110 and block 120, method 100 includes forming a first dielectric layer over a device substrate and forming a first interconnect opening in the first dielectric layer to expose an underlying conductive feature, such as an interconnect of the MLI feature or a conductive feature of the device substrate (for example, a gate or a source/drain feature). In some embodiments, the dielectric layer includes an interlayer dielectric layer disposed over an etch stop layer. At block 130, a first interconnect is formed in the first interconnect opening. For example, a diffusion barrier layer is formed over sidewall surfaces (defined, for example, by the dielectric layer) and a bottom surface (defined, for example, by the underlying conductive feature) that define the interconnect opening at block 132; a bulk layer is formed over the diffusion barrier layer, such that the diffusion barrier layer and the bulk layer fill the interconnect opening, at block 134; and a capping layer is formed over the bulk layer and, in some embodiments, over the diffusion barrier layer at block 136. In some embodiments, the bulk layer includes copper, the capping layer includes metal, such as cobalt, and nitrogen, and the first interconnect is a copper interconnect. At block 140, an etch stop layer is deposited over the first interconnect. The etch stop layer includes metal, such as aluminum, and nitrogen. A region proximate an interface between the etch stop layer and the first interconnect is referred to as an interface region, which includes an interface between the etch stop layer and the capping layer and an interface between the capping layer and the bulk layer. In some embodiments, the capping layer is omitted from the first interconnect, and the interface region includes an interface between the etch stop layer and the bulk layer. At block 150, a nitrogen plasma treatment is performed on the etch stop layer to increase nitrogen concentration and/or nitrogen bonding at the interface region, as described herein. Increasing the nitrogen concentration and/or the nitrogen bonding at the interface region improves metal diffusion blocking ability of the interface region, such that the interface region can prevent metal ions/atoms and/or metal vacancies from diffusing from the bulk layer of the first interconnect to surrounding layers via the interface region during subsequent processing of the MLI feature, such as that associated with blocks 160-180. Improving diffusion blocking ability of the interface region has been observed to minimize (and even eliminate) void formation at the interface region. Method 100 then proceeds with forming a second dielectric layer over the etch stop layer at block 160, forming a second interconnect opening in the second dielectric layer to expose the first interconnect at block 170, and forming a second interconnect (which can be similar to the first interconnect) in the second interconnect opening at block 180. Additional steps can be provided before, during, and after method 100, and some of the steps described can be moved, replaced, or eliminated for additional embodiments of method 100.

FIGS. 2A-2I are fragmentary diagrammatic views of a portion 200 of a multi-layer interconnect (MLI) feature, such as an MLI feature 400 as depicted in FIG. 4, at various fabrication stages (such as those associated with method 100 of FIG. 1) according to various aspects of the present disclosure. MLI feature 400 electrically couples various devices (for example, transistors, resistors, capacitors, and/or inductors) and/or components (for example, gates and/or source/drain features) of an IC device, such that the various devices and/or components can operate as specified by design requirements. MLI feature 400 includes a combination of dielectric layers and metal layers configured to form various interconnects. The metal layers are configured to form vertical interconnects, such as device-level contacts and/or vias, and horizontal interconnects, such as conductive lines. Vertical interconnects typically connect horizontal interconnects in different layers (or different planes) of MLI feature 400. During operation of the IC device, the interconnects route signals between the devices and/or the components of the IC device and/or distribute signals (for example, clock signals, voltage signals, and/or ground signals) to the devices and/or the components, along with routing and distributing signals between the devices and/or components of the IC device with devices and/or components external to the IC device. It is noted that though MLI feature 400 will be depicted with a given number of dielectric layers and metal layers, the present disclosure contemplates MLI feature 400 having more or less dielectric layers and/or metal layers. FIGS. 2A-2I have been simplified for the sake of clarity to better understand the inventive concepts of the present disclosure. Additional features can be added in portion 200 of the MLI feature and/or MLI feature 400, and some of the features described below can be replaced, modified, or eliminated in other embodiments of portion 200 of the MLI feature and/or MLI feature 400.

Figure 2B:
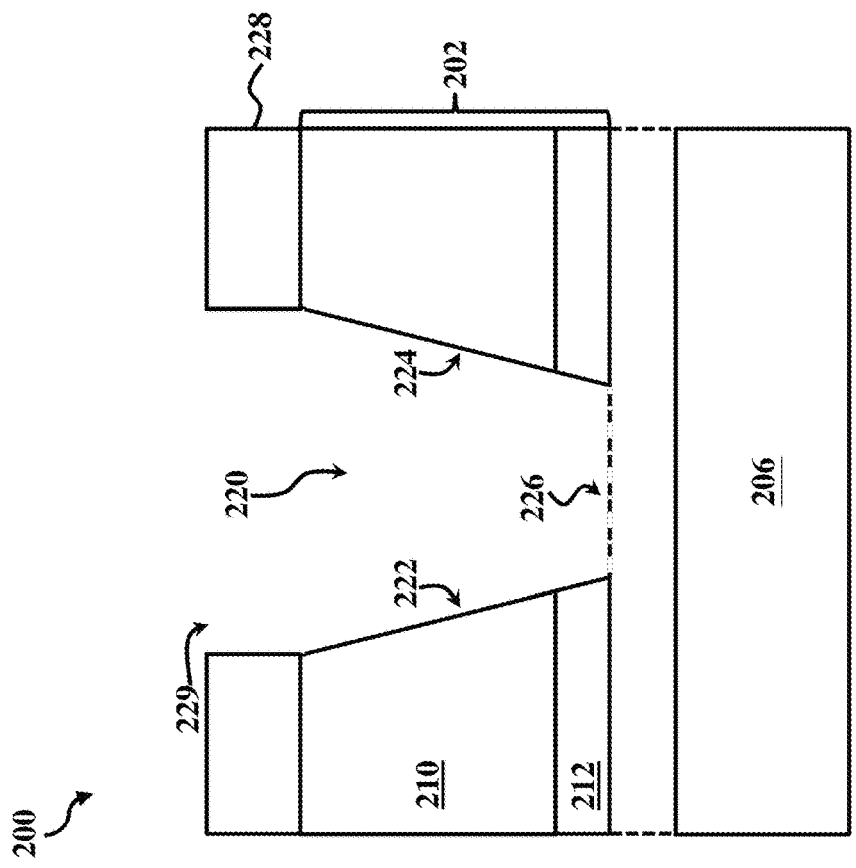
Figure 2A:
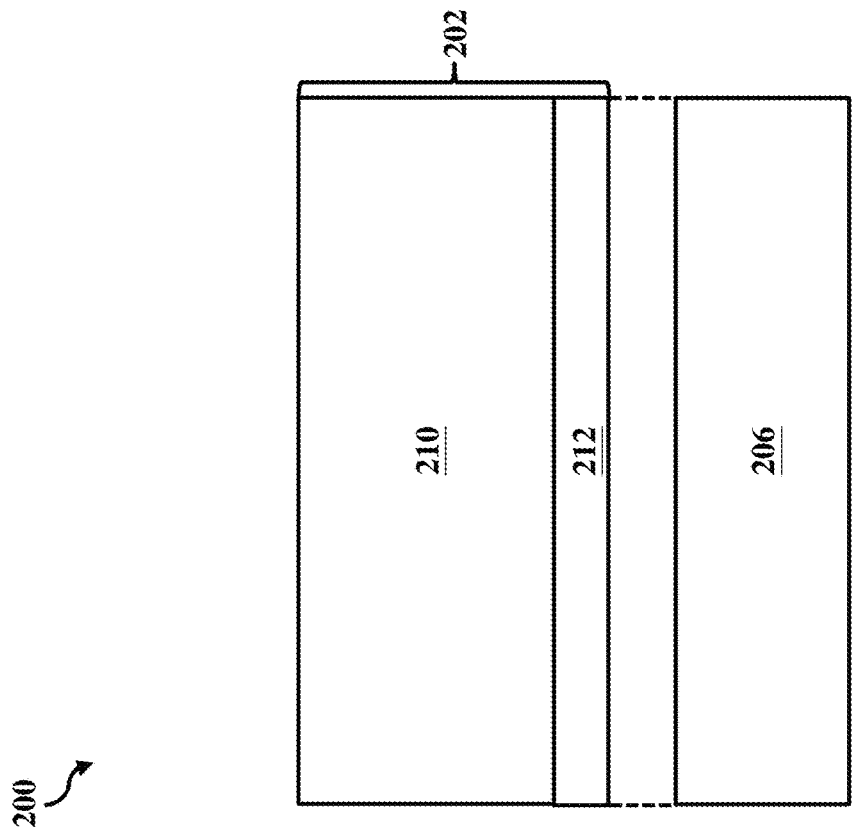

Turning to FIG. 2A, a dielectric layer 202 is formed over a device substrate 206. In the depicted embodiment, dielectric layer 202 includes an interlayer dielectric (ILD) layer 210 disposed over a contact etch stop layer (CESL) 212. In some embodiments, a thickness of ILD layer 210 is about 20 nm to about 30 nm, and a thickness of CESL 212 is about 1 nm to about 3 nm. ILD layer 210 and/or CESL 212 are formed over device substrate 206 by a deposition process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low pressure CVD (LPCVD), atomic layer CVD (ALCVD), atmospheric pressure CVD (APCVD), plasma enhanced ALD (PEALD), other suitable deposition methods, or combinations thereof. In some embodiments, ILD layer 210 is formed by a high aspect ratio process (HARP), such as HDPCVD, which generally refers to a deposition process having parameters configured to achieve adequately filling in high aspect ratio structures. In some embodiments, ILD layer 210 is formed by a flowable CVD (FCVD) process that includes, for example, depositing a flowable material (such as a liquid compound) over device substrate 206 and converting the flowable material to a solid material by a suitable technique, such as thermal annealing and/or treating the flowable material with ultraviolet radiation. Subsequent to the deposition of ILD layer 210 and/or CESL 212, a CMP process and/or other planarization process may be performed, such that ILD layer 210 and/or CESL 212 have substantially planar surfaces.

ILD layer 210 includes a dielectric material including, for example, silicon oxide, carbon doped silicon oxide, silicon nitride, silicon oxynitride, tetraethyl orthosilicate (TEOS), phosphosilicate glass (PSG), boron silicate glass (BSG), boron-doped phosphosilicate glass (BPSG), fluorine-doped silicate glass (FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other suitable dielectric material, or combinations thereof. In some embodiments, ILD layer 210 includes a low-k dielectric material, which generally refers to a dielectric material having a low dielectric constant relative to the dielectric constant of silicon dioxide (k≈3.9). For example, low-k dielectric material has a dielectric constant less than about 3.9. In some embodiments, the low-k dielectric material has a dielectric constant less than about 2.5, which can be referred to as an extreme low-k (ELK) dielectric material. In the depicted embodiment, ILD layer 210 includes an ELK dielectric material (and thus can be referred to as an ELK dielectric layer), such as silicon dioxide ($SiO_2$) (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. CESL 212 includes a material different than ILD layer 210, such as a dielectric material that is different than the dielectric material of ILD layer 210. For example, where ILD layer 210 includes silicon and oxygen (for example, SiCOH, $SiO_x$, or other silicon-and-oxygen comprising material having a dielectric constant less than about 2.5), CESL 212 can include silicon and nitrogen and/or carbon (for example, SiN, SiCN, SiCON, SiON, SiC, and/or SiCO) (and can thus be referred to as a silicon nitride layer). In some embodiments, CESL 212 is configured similar to other CESLs as described herein, such as a metal nitride layer. ILD layer 210 and/or CESL 212 can include a multilayer structure having multiple dielectric materials.

Turning to FIG. 2B, an interconnect opening 220 is formed in dielectric layer 202 by a patterning process. Interconnect opening 220 extends vertically through ILD layer 210 and CESL 212 to expose an underlying MLI feature (for example, a device-level contact, a via, or a conductive line of MLI feature 400) and/or an underlying feature of device substrate 206 (for example, a gate or a source/drain feature). Interconnect opening 220 includes a sidewall 222 (defined by dielectric layer 202), a sidewall 224 (defined by dielectric layer 202), and a bottom 226 (defined by the underlying feature) that extends between sidewall 222 and sidewall 224. In FIG. 2B, interconnect opening 220 has a trapezoidal shape, though the present disclosure contemplates interconnect opening 220 having other shapes, such as a rectangular shape. Sidewalls 222, 224 of interconnect opening 220 are tapered, such that a width of interconnect opening 220 decreases along a thickness of dielectric layer 202 and a width of interconnect opening 220 exposing the underlying feature is less than a width of interconnect opening 220 at a top surface of ILD layer 210. In some embodiments, the patterning process includes performing a lithography process to form a patterned mask layer 228 having an opening 229 therein over dielectric layer 202 and performing an etching process to transfer a pattern defined in patterned mask layer 228 to dielectric layer 202. The lithography process can include forming a resist layer on dielectric layer 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the exposure process can be implemented or replaced by other methods, such as maskless lithography, electron-beam writing, and/or ion-beam writing.

In some embodiments, the patterned resist layer is patterned mask layer 228. In such embodiments, the patterned resist layer is used as an etch mask to remove portions of dielectric layer 202 exposed by opening 229. In some embodiments, the patterned resist layer is formed over a mask layer formed over dielectric layer 202 before forming the resist layer, and the patterned resist layer is used as an etch mask to remove portions of the mask layer formed over dielectric layer 202, thereby forming patterned mask layer 228. In such embodiments, the patterned mask layer is used as an etch mask to remove portions of dielectric layer 202 exposed by opening 229. The etching process can include a dry etching process (for example, a reactive ion etching (RIE) process), a wet etching process, other suitable etching process, or combinations thereof. Various selective etching processes can be performed to form interconnect opening 220. For example, the etching process can include a first etch that selectively etches ILD layer 210 relative to patterned mask layer 228 and CESL 212, such that the first etch stops upon reaching CESL 212, and a second etch that selectively etches CESL 212 relative to ILD layer 210 and the underlying feature, such that the second etch stops upon reaching the underlying feature. In some embodiments, the first etch and/or the second etch may be configured to slightly over etch, such that the first etch may partially etch CESL 212 and/or the second etch may partially etch the underlying feature. In some embodiments, the first etch and the second etch are similar to etch processes described herein for etching ILDs and CESLs. In some embodiments, the etching process may include multiple steps (stages) for etching CESL 212. In some embodiments, after the etching process, patterned mask layer 228 is removed from ILD layer 210 (in some embodiments, by a resist stripping process). In some embodiments, patterned mask layer 228 is removed during etching of ILD layer 210 and/or CESL 212.

Figure 2D:
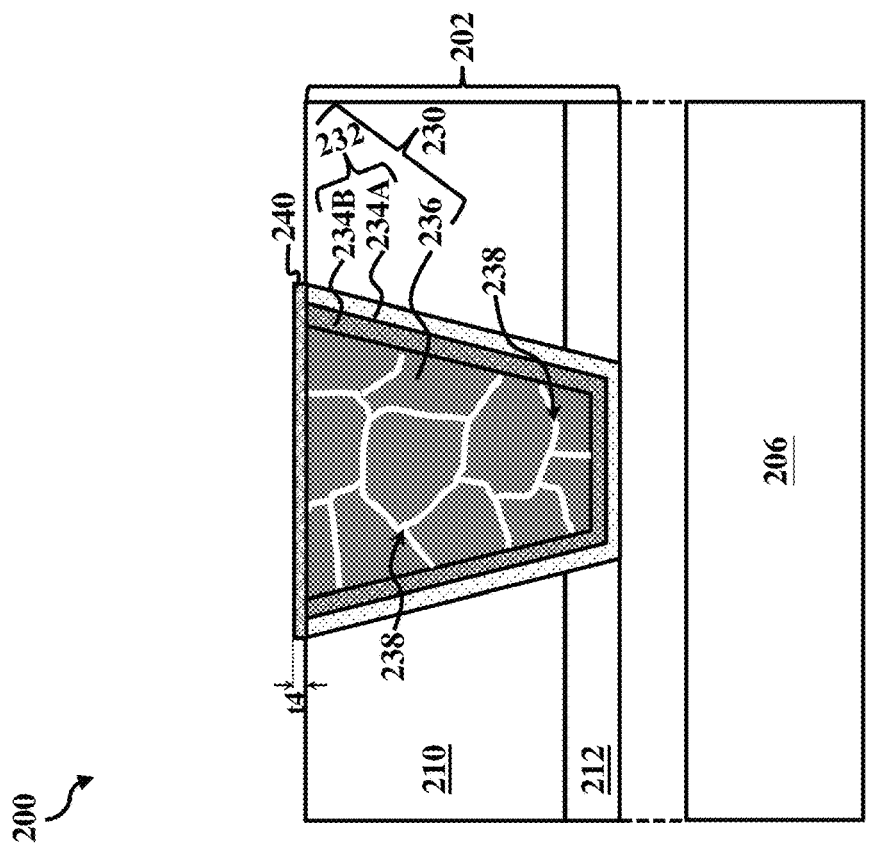
Figure 2C:
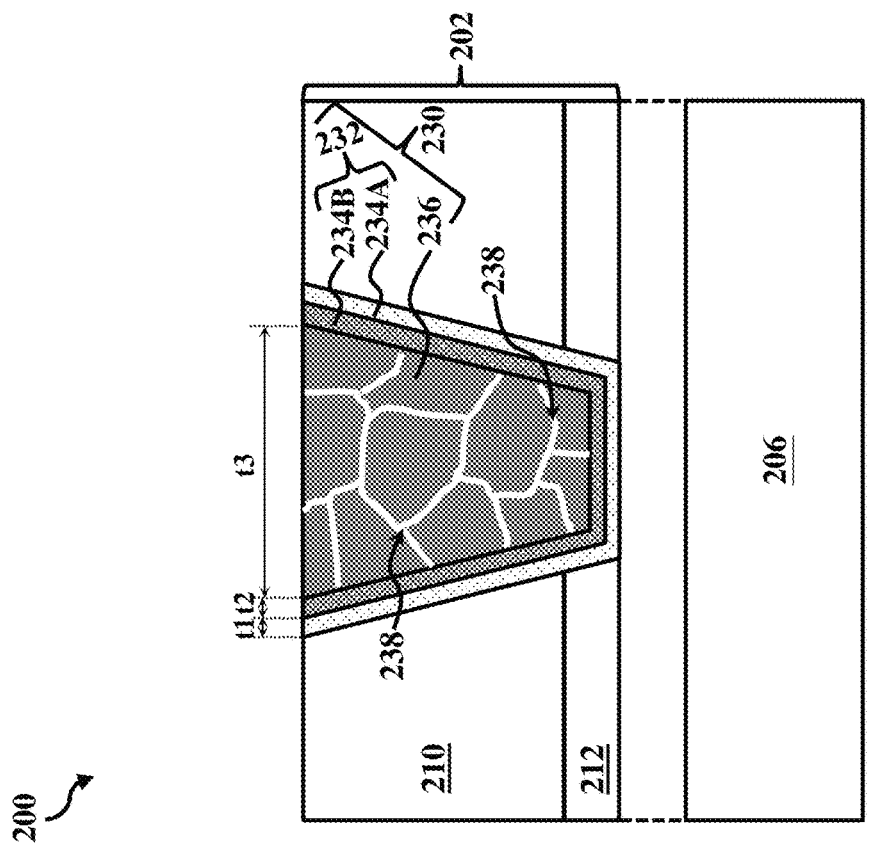

Turning to FIG. 2C, a copper interconnect 230 is formed in interconnect opening 220. Copper interconnect 230 includes a diffusion barrier layer 232 (having a first barrier layer 234A and a second barrier layer 234B) and a copper bulk layer 236 disposed over diffusion barrier layer 232. Diffusion barrier layer 232 is disposed on sidewalls 222, 224 and bottom 226 of interconnect opening 220 defined by ILD layer 210, CESL 212, and the underlying feature. For example, first barrier layer 234A physically contacts sidewalls 222, 224 and bottom 226 of interconnect opening 220 defined by ILD layer 210, CESL 212, and the underlying feature, and second barrier layer 234B is disposed on and physically contacts first barrier layer 234A, such that second barrier layer 234B extends along sidewalls 222, 224 and bottom 226 of interconnect opening 220 defined by ILD layer 210, CESL 212, and the underlying feature. In some embodiments, a thickness of diffusion barrier layer 232 (a sum of a thickness t1 of first barrier layer 234A and a thickness t2 of second barrier layer 234B) is less than or equal to about 9 nm. For example, in some embodiments, thickness t1 is about 2 nm to about 5 nm, and thickness t2 is about 2 nm to about 4 nm. In some embodiments, copper interconnect 230 is formed by performing a first deposition process to form a first barrier material over ILD layer 210 that partially fills interconnect opening 220; performing a second deposition process to form a second barrier material over the first barrier material, where the second barrier material partially fills interconnect opening 220; and performing a third deposition process to form a copper bulk material over the second barrier material, where the copper bulk material fills a remainder of interconnect opening 220. In such embodiments, first barrier material, second barrier material, and copper bulk material are disposed in interconnect opening 220 and over the top surface of ILD layer 210. The first deposition process, the second deposition process, and the third deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, first barrier layer 234A and second barrier layer 234B have substantially uniform thicknesses along sidewalls 222, 224 and bottom 226 of interconnect opening 220. First barrier layer 234A and second barrier layer 234B may thus be formed by a conformal deposition process. A CMP process and/or other planarization process is performed to remove excess copper bulk material, second barrier material, and first barrier material, for example, from over the top surface of ILD layer 210, resulting in copper interconnect 230 (in other words, diffusion barrier layer 232 and copper bulk layer 236 filling interconnect opening 220). The CMP process planarizes a top surface of copper interconnect 230, such that in some embodiments, the top surface of ILD layer 210 and a top surface of copper interconnect 230 form a substantially planar surface.

Diffusion barrier layer 232 is configured to facilitate adhesion between dielectric layer 202 (here, dielectric surfaces defining interconnect opening 220) and copper bulk layer 236 and prevent diffusion of copper constituents (for example, copper atoms/ions) from copper interconnect 230 into dielectric layer 202. For example, first barrier layer 234A includes a material that prevents copper diffusion from copper bulk layer 236 into dielectric layer 202 and promotes adhesion between copper bulk layer 236 and dielectric layer 202, and second barrier layer 234B includes a material that promotes adhesion between first barrier layer 234A and copper bulk layer 236 (thereby functioning as a glue (adhesion) layer between first barrier layer 234A and copper bulk layer 236). Materials of first barrier layer 234A and second barrier layer 234B also exhibit low electrical resistivity to maximize electrical conductivity of copper interconnect 230. In some embodiments, first barrier layer 234A includes tantalum, tantalum alloy, titanium, titanium alloy, tungsten, tungsten alloy, cobalt, cobalt alloy, molybdenum, molybdenum alloy, other suitable constituent configured to prevent copper from diffusing from a copper-based material into a dielectric material and promote adhesion between the copper-based material and the dielectric material, or combinations thereof. For example, first barrier layer 234A includes tantalum, tantalum nitride, titanium, titanium nitride, tungsten, tungsten nitride, tantalum silicon nitride, titanium silicon nitride, tantalum carbide, titanium carbide, tungsten carbide, molybdenum nitride, or combinations thereof. In the depicted embodiment, first barrier layer 234A includes tantalum and nitrogen and can be referred to as a tantalum nitride (TaN) barrier layer. Tantalum exhibits low resistance to electrical current and adheres well to dielectric materials, such as those of ILD layer 210 and/or CESL 212, enhancing electrical conductivity of copper interconnect 230 and minimizing (or eliminating) gaps formed between copper interconnect 230 and dielectric layer 202. Tantalum in combination with nitrogen also exhibits desirable copper-diffusion blocking properties. In some embodiments, the TaN barrier layer includes a tantalum concentration of about 55 atomic percent (at %) to about 60 at % and a nitrogen concentration of about 35 at % to about 40 at %. In some embodiments, second barrier layer 234B includes tantalum, tantalum alloy, titanium, titanium alloy, tungsten, tungsten alloy, cobalt, cobalt alloy, ruthenium, ruthenium alloy, palladium, palladium alloy, molybdenum, molybdenum alloy, other suitable constituent configured to promote adhesion between a copper diffusion barrier material, such as tantalum nitride, and a copper-based material, or combinations thereof. For example, second barrier layer 234B includes cobalt, cobalt nitride, ruthenium, palladium, tantalum, titanium, tungsten, tantalum silicon nitride, titanium silicon nitride, tantalum aluminum nitride, titanium aluminum nitride, or combinations thereof. In the depicted embodiment, second barrier layer 234B includes cobalt and can be referred to as a cobalt (Co) layer. Cobalt exhibits low resistance to electrical current and adheres well to tantalum nitride and copper-based materials, enhancing electrical conductivity of copper interconnect 230 and minimizing (or eliminating) gaps formed between copper bulk layer 236 and first barrier layer 234A. In some embodiments, second barrier layer 234B includes a cobalt concentration of greater than or equal to about 99 at %.

Copper bulk layer 236 includes copper or copper alloy. In some embodiments, copper bulk layer 236 includes a copper concentration that is greater than or equal to about 99 at %, for example, about 99 at % to about 99.5 at %. Copper bulk layer 236 has grain boundaries 238, which generally indicate interfaces between copper grains (or crystallites) of copper (or copper alloy), for example, in polycrystalline form. Grain boundaries 238 provide pathways for copper ions/atoms and copper vacancies to travel in copper bulk layer 236, which allow copper ions/atoms and copper vacancies to migrate to interfaces between copper interconnect 230 and its surrounding layers. Such migration can lead to diffusion of copper ions/atoms from copper bulk layer 236 at interfaces of copper interconnect 230 with surrounding dielectric materials and/or accumulation of copper vacancies at the interfaces, which can lead to void formation in copper interconnect 230. As described further below, the present disclosure proposes solutions for addressing these challenges as ICs shrink into 20 nm and beyond IC technology nodes. Copper bulk layer 236 has a thickness t3, which, in some embodiments, is about 20 nm to about 40 nm. In some embodiments, copper bulk layer 236 includes a copper-comprising seed (or liner) layer disposed between second barrier layer 234B and a copper-comprising bulk layer. In such embodiments, copper-comprising seed layer is disposed on second barrier layer 234B, such that the copper-comprising seed layer extends along sidewalls 222, 224 and bottom 226 of interconnect opening 220 defined by ILD layer 210, CESL 212, and the underlying feature. In some implementations, copper-comprising seed layer has a thickness of about 30 nm to about 40 nm, and copper-comprising bulk layer has a thickness of about 30 nm to about 40 nm. In some embodiments, copper-comprising seed layer is formed by an ALD process, and copper-comprising bulk layer is formed by a CVD process or a PVD process.

Turning to FIG. 2D, processing proceeds with forming a capping layer 240 of copper interconnect 230. Capping layer 240 covers first barrier layer 234A, second barrier layer 234B, and copper bulk layer 236. In some embodiments, capping layer 240 may cover only copper bulk layer 236. Capping layer 240 has a thickness t4. In the depicted embodiment, thickness t4 is less than or equal to about 4 nm. In some embodiments, thickness t4 is about 2 nm to about 4 nm. Capping layer 240 includes a material that promotes adhesion between copper interconnect 230 and a subsequently formed dielectric layer, such as a CESL. For example, capping layer 240 includes metal (for example, cobalt) and nitrogen, and thus may be referred to as a metal nitride capping layer. In FIG. 2D, capping layer 240 includes cobalt and nitrogen, and thus, may be referred to as a cobalt nitride (CoN) capping layer. In some embodiments, the CoN capping layer includes a cobalt concentration of about 80 at % to about 90 at % and a nitrogen concentration of about 10 at % to about 20 at %. In some embodiments, the CoN layer is formed by depositing a cobalt layer over copper interconnect 230, for example, by an ALD process, and performing a nitrogen plasma treatment on the cobalt layer to incorporate (drive) nitrogen into the cobalt layer, thereby forming the CoN layer. In some embodiments, the ALD process or other suitable deposition process implements a cobalt-containing precursor, such as bis-cyclopentadienyl cobalt ($CoCp_2$), cyclopentadienyl cobalt dicarbonyl ($CpCo(CO)_2$), bis(ηmethylcyclopentadienyl) cobalt ($Co(MeCp)_2$), dicobalt hexcarbonyl tertbutylacctylene (CCTBA), cobalt tricarbonyl nitrosyl ($Co(CO)_3NO$), cyclopentadienyl isopropyl acet-amidinato cobalt (Co(CpAMD)), bis(cyclopentadienyl)co-balt ($Co(C_5H_5)_2, CpCo(CO)_2$), bis(ethylcyclopentadienyl) cobalt ($C_{14}H_{18}Co$), cobalt tris(2,2,6,6-tetramethyl-3,5-heptanedionate), bis(pentamethylcyclopentadienyl)cobalt ($C_{20}H_{30}Co$), other suitable cobalt-containing precursor, or combinations thereof. In some embodiments, the nitrogen plasma treatment generates nitrogen-containing plasma from a suitable nitrogen-containing precursor gas. The nitrogen-containing precursor can include nitrogen ($N_2$), ammonia ($NH_3$), hydrazine ($N_2H_4$), dimethylhydrazine, tert-butyl-hydrazine, tert-butylamine, other suitable nitrogen-containing precursor, or combinations thereof. In some embodiments, the nitrogen plasma treatment implements a flow rate of the nitrogen-containing precursor (e.g., $NH_3$) of about 300 sccm to about 5,000 sccm. In some embodiments, a power used to generate the nitrogen-containing plasma is about 200 W to about 700 W. In some embodiments, the nitrogen plasma treatment is performed for about 3 seconds to about 100 seconds. In some embodiments, a pressure maintained in the process chamber during the nitrogen plasma treatment is about 1 torr to about 15 torr. In some embodiments, a temperature maintained in the process chamber during the nitrogen plasma treatment is about 150° C. to about 450° C. In some embodiments, capping layer 240 may be formed by CVD, PVD, HDPCVD, MOCVD, RPCVD, PECVD, LPCVD, ALCVD, APCVD, PEALD, electroplating, electroless plating, other suitable deposition methods, or combinations thereof. The present disclosure further contemplates embodiments where capping layer 240 includes other materials and/or combinations of materials that promote adhesion between copper interconnect 230 and the subsequently formed dielectric layer, along with embodiments where copper interconnect 230 does not include capping layer 240 (in which case, such processing step is omitted from fabrication of portion 200).

Figure 2E:
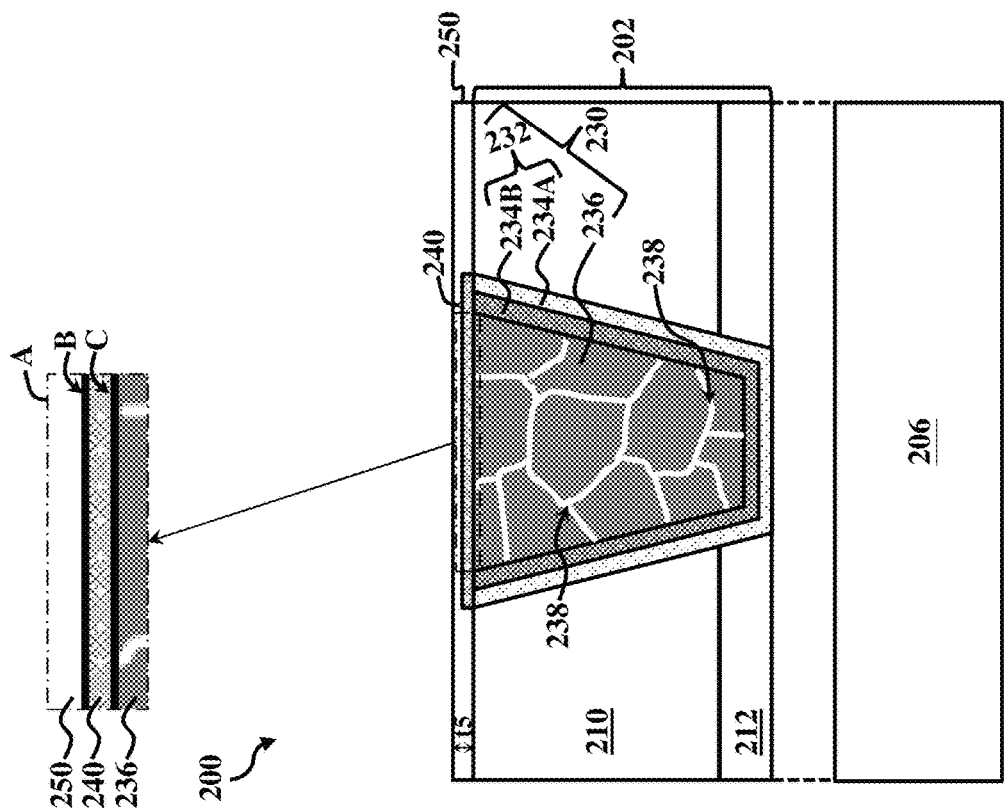

Turning to FIG. 2E, a CESL 250 is formed over dielectric layer 202 and copper interconnect 230 by a suitable deposition process, such as CVD, PVD, ALD, HDPCVD, MOCVD, RPCVD, PECVD, LPCVD, ALCVD, APCVD, PEALD, electroplating, electroless plating, other suitable deposition methods, or combinations thereof. In the depicted embodiment, CESL 250 is deposited on ILD layer 210 and capping layer 240 of copper interconnect 230, such that CESL 250 physically contacts ILD layer 210 and capping layer 240. A thickness t5 of CESL 250 is greater than thickness t4. In the depicted embodiment, thickness t5 is less or equal to about 3 nm. In some embodiments, thickness t5 is about 1 nm to about 2.5 nm. In embodiments where capping layer 240 is omitted from copper interconnect 230, CESL 250 physically contacts copper bulk layer 236, second barrier layer 234A, and first barrier layer 234B. CESL 250 includes a material that is different than a material of copper interconnect 230 (for example, a material of capping layer 240) and a subsequently formed ILD layer to achieve etching selectivity during subsequent etching processes, such as those used to form an interconnect opening that exposes copper interconnect 230. In other words, CESL 250 and its surrounding layers will include materials having distinct etching sensitivities to a given etchant. For example, CESL 250 includes a material having an etch rate to an etchant that is less than an etch rate of a material of an ILD layer to the etchant so that the material of CESL 250 acts as an etch stop during etching of an overlying ILD layer (including, for example, a low-k dielectric material). The material of CESL 250 is also selected to prevent copper diffusion from copper bulk layer 236 into surrounding layers, such as the subsequently formed ILD layer. In some embodiments, CESL 250 includes metal and nitrogen, and thus may be referred to as a metal nitride CESL. The metal can include aluminum, hafnium, titanium, copper, manganese, vanadium, other suitable metal, or combinations thereof. In the depicted embodiment, the metal is aluminum, and CESL 250 is an aluminum nitride (AlN) CESL. Aluminum in combination with nitrogen exhibits desirable copper-diffusion blocking properties. CESL 250 includes a nitrogen concentration that is greater than the nitrogen concentration of capping layer 240. For example, CESL 250 includes an aluminum concentration of about 52 at % to about 58 at % and a nitrogen concentration of about 42 at % to about 48 at %. As described below, a nitrogen concentration at an interface between CESL 250 and capping layer 240 may not sufficiently block copper diffusion as IC technology nodes shrink, particularly copper diffusion associated with BEOL processing, such as fabrication of portion 200. The present disclosure thus provides an interconnect fabrication process that increases the nitrogen concentration at the interface between CESL 250 and capping layer 240, and in particular, increases a surface nitrogen concentration of CESL 250 at the interface between CESL 250 and capping layer 240.

In some embodiments, ALD is performed to form the AlN CESL. FIG. 4 is a flow chart of an ALD process 300, which can be implemented at block 140 in FIG. 1, according to various aspects of the present disclosure. At block 302, a workpiece is loaded into a process chamber, where the process chamber is prepared for an ALD process to form a contact etch stop layer, such as CESL 250, over a dielectric layer having an interconnect disposed therein. At block 304, the workpiece is exposed to an aluminum-containing precursor (which can be referred to as an aluminum-containing pulse). At block 306, a purge process is performed to remove any remaining aluminum-containing precursor and any byproducts from the process chamber. At block 308, the workpiece is exposed to a nitrogen-containing precursor (which can be referred to as a nitrogen-containing pulse). At block 310, a purge process is performed to remove any remaining nitrogen-containing precursor and any byproducts from the process chamber. Blocks 304-310 constitute one ALD cycle, which includes two deposition phases (block 304 and block 308) and two purge phases (block 306 and block 310). Each ALD cycle is a self-limiting process, where less than or equal to about one aluminum-and-nitrogen comprising monolayer is deposited during each ALD cycle. The ALD cycle is repeated until a contact etch stop layer, such as CESL 250, reaches a desired (target) thickness. For example, at block 312, if a thickness of CESL 250 equals a target thickness (or is within a given threshold of the target thickness), then ALD process 300 ends at block 314. If the thickness of CESL 250 does not equal the target thickness (or is not within the given threshold of the target thickness), then ALD process 300 returns to block 304 to begin another ALD cycle. In some embodiments, the ALD cycle (blocks 304-310) is repeated until CESL 250 has a thickness of about 1 nm to about 2.5 nm. Various parameters of the ALD process 300 can be tuned to achieve desired growth characteristics, such as a flow rate of a deposition gas (including the aluminum-containing precursor gas, the nitrogen-containing precursor gas, and/or a carrier gas), a concentration (or dosage) of the aluminum-containing precursor gas, a concentration (or dosage) of the nitrogen-containing precursor gas, a concentration (or dosage) of the carrier gas, a ratio of the concentration of the aluminum-containing precursor gas to the concentration of the carrier gas, a ratio of the concentration of the nitrogen-containing precursor gas to the concentration of the carrier gas, a power of a radiofrequency (RF) source (for example, used during the deposition process to generate a plasma), a bias voltage (for example, applied during the deposition process to excite the plasma), a pressure of the process chamber, a duration of the deposition process, other suitable deposition parameters, or combinations thereof. Additional steps can be provided before, during, and after ALD process 300, and some of the steps described can be moved, replaced, or eliminated for additional embodiments of ALD process 300.

The aluminum-containing precursor at block 304 can include trimethylaluminum (TMA), triethylaluminum (TEA), trimethylamine alane, aluminum chloride, dimethylaluminum hydride (DMAH), diethylaluminum ethoxide (DEAL), other aluminum-containing precursor, or combinations thereof. In such embodiments, during the aluminum-containing pulse, aluminum and/or other aluminum-containing precursor and/or reaction constituents adsorb onto exposed surfaces of ILD layer 210 and/or capping layer 240 to form a layer that includes aluminum and/or other aluminum-containing precursor and/or reaction constituents. In some embodiments, a flow rate of the aluminum-containing precursor is about 6,000 sccm to about 8,000 sccm. In some embodiments, the aluminum-containing pulse duration is about 20 seconds to about 30 seconds. In some embodiments, a pressure maintained in the process chamber during the aluminum-containing pulse is about 2.0 torr to about 3.0 torr. In some embodiments, a temperature maintained in the process chamber during the aluminum-containing pulse is about 300° C. to about 350° C. In some embodiments, a carrier gas is used to deliver the aluminum-containing precursor to the process chamber. In some embodiments, the carrier gas is an inert gas, such as an argon-containing gas, a helium-containing gas, other suitable inert gas, or combinations thereof. In some embodiments, the purge process at block 306 implements an inert gas, such as an argon-containing gas, a helium-containing gas, other suitable inert gas, or combinations thereof. In some embodiments, a flow rate of the inert gas is about 4,000 sccm to about 5,000 sccm. In some embodiments, the purge process duration is about 20 seconds to about 30 seconds. In some embodiments, a pressure maintained in the process chamber during the purge process is about 2.0 torr to about 3.0 torr.

The nitrogen-containing precursor at block 308 can include nitrogen ($N_2$), ammonia ($NH_3$), hydrazine ($N_2H_4$), dimethylhydrazine, tert-butylhydrazine, tert-butylamine, other suitable nitrogen-containing precursor, or combinations thereof. In such embodiments, nitrogen and/or other nitrogen-containing precursor and/or reaction constituents interact with the layer that includes aluminum and/or other aluminum-containing precursor and/or reaction constituents, thereby forming less than or equal to about one monolayer that includes aluminum and nitrogen, such as an AlN layer (for example, nitrogen adsorbs onto the layer including aluminum). In some embodiments, a flow rate of the nitrogen-containing precursor (e.g., $NH_3$) is about 5,000 sccm to about 10,000 sccm. In some embodiments, the nitrogen-containing pulse duration is about 1 second to about 20 seconds. In some embodiments, a pressure maintained in the process chamber during the nitrogen-containing pulse is about 1 torr to about 3 torr. In some embodiments, a temperature maintained in the process chamber during the nitrogen-containing pulse is about 300° C. to about 400° C. In some embodiments, a carrier gas is used to deliver the nitrogen-containing precursor to the process chamber. In some embodiments, the carrier gas is an inert gas, such as an argon-containing gas, a helium-containing gas, other suitable inert gas, or combinations thereof. In some embodiments, the purge process at block 310 implements an inert gas, such as an argon-containing gas, a helium-containing gas, other suitable inert gas, or combinations thereof. In some embodiments, a flow rate of the inert gas is about 2,000 sccm to about 7,000 sccm. In some embodiments, the purge process duration is about 1 second to about 10 seconds. In some embodiments, a pressure maintained in the process chamber during the purge process is about 1 torr to about 3 torr.

In some embodiments, CVD is performed to form the AlN CESL. For example, a workpiece is loaded into a process chamber, where the process chamber is prepared for a CVD process to form a contact etch stop layer, such as CESL 250, over a dielectric layer having an interconnect disposed therein. In the process chamber, the workpiece is exposed to an aluminum-containing precursor and a nitrogen-containing precursor, which both react with exposed surfaces of the dielectric layer and the interconnect to form an aluminum-and-nitrogen comprising layer. The workpiece is exposed to the aluminum-containing precursor and the nitrogen-containing precursor until a contact etch stop layer reaches a desired (target) thickness, such as a thickness of about 1 nm to about 2.5 nm. Thereafter, a purge process is performed to remove any remaining aluminum-containing precursor, nitrogen-containing precursor, and any byproducts from the process chamber. The aluminum-containing precursor can include TMA, TEA, trimethylamine alane, aluminum chloride, DMAH, DEAL, other aluminum-containing precursor, or combinations thereof. The nitrogen-containing precursor can include $N_2$, $NH_3$, $N_2H_4$, dimethylhydrazine, tert-butylhydrazine, tert-butylamine, other suitable nitrogen-containing precursor, or combinations thereof. Various parameters of the CVD process can be tuned to achieve desired growth characteristics (for example, thickness, aluminum concentration, and/or nitrogen concentration of the AlN layer), such as a flow rate of a deposition gas (including the aluminum-containing precursor gas, the nitrogen-containing precursor gas, and/or a carrier gas), a concentration of the aluminum-containing precursor gas, a concentration of the nitrogen-containing precursor gas, a concentration of the carrier gas, a ratio of the concentration of the aluminum-containing precursor gas to the concentration of the nitrogen-containing precursor gas, a ratio of the concentration of the aluminum-containing precursor gas and/or the nitrogen-containing precursor gas to the concentration of the carrier gas, a power of an RF source, a bias voltage, a pressure of the process chamber, a duration of the deposition process, other suitable deposition parameters, or combinations thereof. In some embodiments, a flow rate of the aluminum-containing precursor is about 6,000 sccm to about 8,000 sccm, and a flow rate of the nitrogen-containing precursor is about 4,000 sccm to about 5,000 sccm. In some embodiments, the workpiece is exposed to the aluminum-containing precursor and a nitrogen-containing precursor for about 20 seconds to about 40 seconds. In some embodiments, a pressure maintained in the process chamber during the CVD process is about 2.0 torr to about 3.0 torr. In some embodiments, the nitrogen-containing precursor is used to generate a nitrogen-containing plasma (for example, when the CVD process is a PEALD process) that interacts with the aluminum-containing precursor and/or exposed surfaces of the workpiece. In some embodiments, the nitrogen-containing plasma has a nitrogen concentration of about 70% to about 90%. In some embodiments, a power used to generate a low frequency nitrogen-containing plasma is about 80 W to about 100 W. In some embodiments, a power used to generate a high frequency nitrogen-containing plasma is 500 W to about 650 W. It is noted that ALD is a type of CVD, except ALD exposes the workpiece to the aluminum-containing precursor (or other metal-containing precursor depending on desired composition of CESL 250) and the nitrogen-containing precursor separately.

An interface region A between CESL 250 and copper interconnect 230 (generally referred to hereafter as CESL/copper interface A) includes an interface B between CESL 250 and capping layer 240 and an interface C between capping layer 240 and copper bulk layer 236. The present disclosure recognizes that stress-induced voiding (stress migration) at CESL/copper interface A has become a major factor in IC device reliability. For example, mechanical stresses in the MLI feature that includes portion 200 can cause copper ions/atoms and copper vacancies to migrate along grain boundaries 238 in copper interconnect 230 to CESL/copper interface A. As the copper vacancies accumulate and the copper atoms/ions diffuse into the MLI feature (for example, the dielectric layers of the MLI feature), voids form at CESL/copper interface A, which can increase resistance of copper interconnect 230 and degrade IC performance. These voids can cause an open circuit depending on location and/or size, and in some instances, lead to copper interconnect failure and/or IC device failure. These mechanical stresses arise during MLI feature processing (in other words, during BEOL processing) because of thermal expansion coefficient mismatches between copper interconnect 230 and its surrounding dielectric materials. For example, because copper interconnect 230 and surrounding dielectric materials (for example, ILD layer 210, CESL 212, and subsequently-formed ILD layers and/or CESLs) have different thermal expansion coefficients, copper interconnect 230 and the surrounding dielectric materials will expand and contract at different rates during BEOL thermal cycles (for example, heating cycles and/or cooling cycles), causing stress differences in portion 200 of the MLI feature that cause the copper ions/atoms and/or copper vacancies to migrate to CESL/copper interface A. Accordingly, the present disclosure proposes performing a nitrogen plasma treatment on CESL 250 before forming an overlying ILD layer, where the nitrogen plasma treatment is configured to increase a concentration of nitrogen and/or increase and/or enhance (strengthen) nitrogen bonding at CESL/copper interface A. Increasing nitrogen concentration and/or nitrogen bonding at CESL/copper interface A limits (and, in some embodiments, eliminates) diffusion of copper ions/atoms and copper vacancies along CESL/copper interface A, thereby preventing accumulation of copper vacancies at CESL/copper interface A and limiting stress-induced void formation in copper interconnect 230, as further detailed below. In some embodiments, before the nitrogen plasma treatment, CESL 250 may have a surface nitrogen concentration (for example, at interface B) of about 10 at % to about 15 at %, which has been observed to provide CESL 250 with insufficient copper diffusion blocking abilities as IC technology nodes shrink, particularly copper diffusion associated with BEOL processing, such as fabrication of portion 200. In such embodiments, by implementing the nitrogen plasma treatment described herein, the surface nitrogen concentration is increased to about 20 at % to about 30 at % after the nitrogen plasma treatment. Such increased surface nitrogen concentrations have been observed to improve copper diffusion blocking capabilities of CESL 250 and reduce voiding.

Figure 2F:
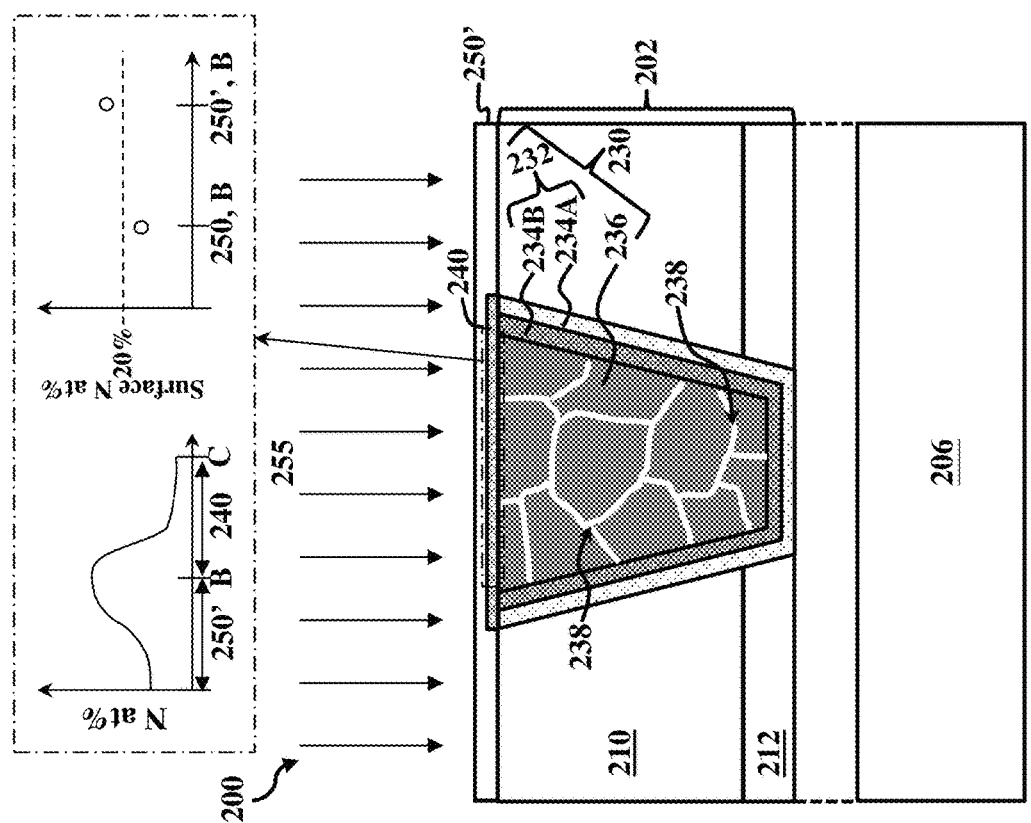

Turning to FIG. 2F, a nitrogen plasma treatment 255 is performed on CESL 250, resulting in nitrogen-treated CESL 250'. Nitrogen-treated CESL 250' has a nitrogen concentration that is greater than a nitrogen concentration of capping layer 240. For example, the nitrogen concentration is about 40 at %. In some embodiments, a ratio of the nitrogen concentration of nitrogen-treated CESL 250' to the nitrogen concentration of capping layer 240 is about 2:1 to about 5:1. In some embodiments, nitrogen-treated CESL 250' has an aluminum concentration of about 52 at % to about 58 at % and a nitrogen concentration of about 42 at % to about 48 at %. It is noted that, in the depicted embodiment, a nitrogen concentration of first barrier layer 234A (e.g., a TaN barrier layer) is less than the nitrogen concentration of nitrogen-treated CESL 250' and greater than the nitrogen concentration of capping layer 240. In some embodiments, a ratio of the nitrogen concentration of nitrogen-treated CESL 250' to the nitrogen concentration of first barrier layer 234A is about 1:1 to about 1.5:1. FIG. 5 is a flow chart of a nitrogen plasma treatment process 350, which can be implemented as nitrogen plasma treatment 255 in FIG. 2F and/or at block 150 in FIG. 1, according to various aspects of the present disclosure. At block 352, a workpiece (including, for example, CESL 250 disposed over copper interconnect 230) is loaded into a process chamber, where the process chamber is prepared for a nitrogen plasma treatment process. In some embodiments, CESL 250 is deposited over copper interconnect 250 in the same process chamber, such that CESL deposition and nitrogen plasma treatment are performed in situ. At block 354, the workpiece is exposed to nitrogen-containing plasma (which is referred to as a nitrogen-containing plasma pulse). The nitrogen-containing plasma bombards CESL 250 with plasma-excited nitrogen-containing species to drive nitrogen into CESL 250, in particular, to CESL/copper interface A. Bombarding CESL 250 with plasma-excited nitrogen-containing species also creates, repairs, and/or enhances nitrogen bonding, such as N—N bonds, Al—N bonds, Co—N bonds, and/or Co—N—Al bonds. In some embodiments, nitrogen-treated CESL 250' has more N—N bonds, Al—N bonds, Co—N bonds, and/or Co—N—Al bonds than CESL 250. For example, FIG. 6 provides a Fourier Transform Infrared (FTIR) spectra obtained by performing FTIR spectroscopy on an AlN bulk film before and after a nitrogen plasma treatment, such as nitrogen plasma treatment 255. In the FTIR spectra, an intensity of absorption of absorbed frequencies/wavenumbers corresponding with Al—N bonds after treatment (≈0.95) is greater than an intensity of absorption of absorbed frequencies/wavenumbers corresponding with Al—N bonds before treatment (≈0.75), which indicates that the nitrogen plasma treatment increases Al—N bonds in the AlN bulk film. Nitrogen plasma treatment 255 can thus be implemented to increase Al—N bonds in CESL 250. Various parameters of nitrogen plasma treatment process 350 are tuned to achieve desired nitrogen concentration and/or nitrogen bonding in CESL 250, such as a flow rate of a nitrogen-containing precursor gas, a flow rate of a carrier gas, a concentration of the nitrogen-containing precursor gas, a concentration of the carrier gas, a ratio of the concentration of the nitrogen-containing precursor gas to the concentration of the carrier gas, a power of an RF source, a bias voltage, a pressure of the process chamber, a duration of the nitrogen plasma treatment process, other suitable parameters, or combinations thereof. At block 356, if necessary, a purge process is performed to remove any remaining nitrogen-containing plasma and any byproducts from the process chamber. In some embodiments, at block 358, if nitrogen-treated CESL 250' exhibits target nitrogen concentration and/or target nitrogen bonding characteristics, then nitrogen plasma treatment process 350 ends at block 360. If not, in some embodiments, block 354 and block 356 (i.e., one cycle) may be repeated until reaching desired target nitrogen concentration and/or target nitrogen bonding characteristics.

The nitrogen-containing plasma is generated from a nitrogen-containing precursor gas that includes diatomic nitrogen ($N_2$), alone, or in combination with $NH_3$, other suitable nitrogen-containing precursor gas, or combinations thereof. Nitrogen plasma treatment 255 can thus be referred to as an $N_2$ plasma treatment process, in some embodiments. In such embodiments, the nitrogen-containing plasma includes nitrogen-containing excited neutral molecules (for example, $N_2^*$), nitrogen-containing ionized molecules (for example, $N_2+$), nitrogen-containing atoms (for example, N), ionized atoms (N+), or combinations thereof (all generally referred to as plasma-excited nitrogen-containing species). The nitrogen-containing plasma is "nitrogen-rich," generally referring to a nitrogen-containing plasma having a nitrogen concentration ($N_2$) that is greater than about 50%. In some embodiments, the nitrogen-containing plasma includes a nitrogen concentration ($N_2$) of about 70% to about 90% to effectively drive nitrogen into CESL 250 towards interface B and/or into capping layer 240 towards interface B and/or interface C, thereby increasing a nitrogen concentration and/or increasing nitrogen bonding at CESL/copper interface A. Nitrogen concentrations in the nitrogen-containing plasma that are less than or equal to about 30% cannot adequately increase a nitrogen concentration and/or increase nitrogen bonding at CESL/copper interface A. In some embodiments, a power used to generate a low frequency nitrogen-containing plasma is about 50 W to about 200 W. In some embodiments, a power used to generate a high frequency nitrogen-containing plasma is about 500 W to about 650 W. In some embodiments, an RF bias voltage and/or direct current (DC) bias voltage are applied to the workpiece to accelerate the nitrogen-containing plasma towards the workpiece. In some embodiments, CESL 250 is exposed to the nitrogen-containing plasma for about 20 seconds to about 30 seconds. In some embodiments, a pressure maintained in the process chamber during nitrogen plasma treatment 255 is about 1 torr to about 2 torr. In some embodiments, a temperature maintained in the process chamber during nitrogen plasma treatment 255 is about 350° C. to about 450° C. In some embodiments, the workpiece is heated to a temperature of about 350° C. to about 450° C. during nitrogen plasma treatment 255.

Nitrogen plasma treatment 255 drives nitrogen into CESL 250, thereby increasing a surface nitrogen concentration and/or nitrogen bonding at CESL/copper interface A, particularly along interface B. In some embodiments, after nitrogen plasma treatment 255, a surface nitrogen concentration at interface B of nitrogen-treated CESL 250' is greater than a surface nitrogen concentration at interface B of CESL 250. For example, nitrogen-treated CESL 250' has a surface nitrogen concentration at interface B that is greater than or equal to about 20 at % (for example, about 20 at % to about 30 at %) and CESL 250 has a surface nitrogen concentration at interface B that is less than about 20 at % (for example, about 10 at % to about 15 at %), as depicted in FIG. 2F. Surface nitrogen concentrations at interface B that are less than about 20 at % cannot sufficiently block copper diffusion, which has been observed to lead to void formation within copper interconnect 230 during subsequent processing. In contrast, surface nitrogen concentrations at interface B that are greater than or equal to about 20 at % can sufficiently reduce copper diffusion and have been observed to reduce, and in some instances, eliminate, void formation in copper interconnect 230 during subsequent processing. In some embodiments, a surface nitrogen concentration of CESL 250 at interface B before nitrogen plasma treatment 255 is about 10 at % to about 15 at % and a surface nitrogen concentration of nitrogen-treated CESL 250' at interface B after nitrogen plasma treatment 255 is about 20 at % to about 25 at %. In some embodiments, a nitrogen concentration of nitrogen-treated CESL 250' has a graded profile, where a nitrogen concentration increases from a top surface of nitrogen-treated CESL 250' along its thickness to interface B, such that nitrogen-treated CESL 250' has a maximum nitrogen concentration along interface B. In some embodiments, nitrogen-treated CESL 250' has other nitrogen concentration profiles, such as a stair profile, a linear continuous profile, a non-linear continuous profile, a bell-curved profile, a saw-tooth profile, or other suitable profile. In some embodiments, nitrogen plasma treatment 255 increases N—N bonding and/or Al—N bonding, such that a number of N—N bonds and/or Al—N bonds in nitrogen-treated CESL 250' (particularly along interface B) is about 20% greater than a number of N—N bonds and/or Al—N bonds in CESL 250. Nitrogen-treated CESL 250' also exhibits different material characteristics than CESL 250 (having a lower nitrogen concentration). For example, a dielectric constant and a density of nitrogen-treated CESL 250' is greater than a dielectric constant and a density of CESL 250. In some embodiments, nitrogen-plasma treatment 255 increases the dielectric constant by about 0.2. For example, nitrogen-treated CESL 250' has a dielectric constant of about 7.2 to about 7.6 (for example, about 7.4) compared CESL 250, which has a dielectric constant less than or equal to about 7. In some embodiments, nitrogen-plasma treatment 255 increases the density by about 0.10. For example, nitrogen-treated CESL 250' has a density of about 2.70 to about 2.80 (for example, about 2.75) compared to CESL 250, which has a density of about 2.60 to about 2.70 (for example, about 2.65).

Nitrogen plasma treatment 255 can also drive nitrogen into capping layer 240, thereby increasing a nitrogen concentration along interface C. For example, in some embodiments, after nitrogen plasma treatment 255, capping layer 240 has a cobalt concentration of about 80 at % to about 90 at % and a nitrogen concentration of about 10 at % to about 20 at %. In some embodiments, a nitrogen concentration of capping layer 240 after nitrogen plasma treatment 255 has a graded profile, where a nitrogen concentration decreases from interface B along its thickness to interface C, such that capping layer 240 has a maximum nitrogen concentration along interface B. In some embodiments, capping layer 240 has other nitrogen concentration profiles, such as a stair profile, a linear continuous profile, a non-linear continuous profile, a bell-curved profile, a saw-tooth profile, or other suitable profile. In some embodiments, a nitrogen concentration profile of nitrogen-treated CESL 250' and capping layer 240 combined increases from the top surface of nitrogen-treated CESL 250' along a thickness of CESL/copper interface A to a peak region proximate interface B and then decreases from the peak region along the thickness of CESL/copper interface A to a bottom surface of capping layer 240 at interface C, such as depicted in FIG. 2F by a plot of the nitrogen concentration in atomic percent in CESL 250' and capping layer 240. In such embodiments, a nitrogen concentration of CESL/copper interface A can be described as having a bell-curve profile, where a peak of the bell-curve is proximate to interface B. In some embodiments, nitrogen plasma treatment 255 increases N—N bonding and/or Co—N bonding, such that a number of N—N bonds and/or Co—N bonds in capping layer 240 after nitrogen plasma treatment 255 (particularly along interface B) is greater than a number of N—N bonds and/or Co—N bonds in capping layer 240 before nitrogen plasma treatment 255. In some embodiments, nitrogen plasma treatment 255 creates, repairs, and/or enhances Co—N—Al bonding between capping layer 240 and nitrogen-treated CESL 250', for example, increasing a number of Co—N—Al bonds at interface B in nitrogen-treated CESL 250' compared to a number of Co—N—Al bonds at interface B in CESL 250.

It is noted that the material of CESL 250 is selected to minimize metal diffusion while also providing sufficient etch stop function during formation of an interconnect opening to expose copper interconnect 230 during subsequent processing. The material of CESL 250 is also selected to minimize its contribution of parasitic capacitance resulting from portion 200 of the MLI feature, which cannot be ignored in smaller IC technology nodes. The present disclosure has recognized that, after undergoing a nitrogen plasma treatment, such as nitrogen plasma treatment 255, metal nitride (in the depicted embodiment, aluminum nitride) performs well as an etch stop layer when etching a low-k dielectric material while also providing excellent copper diffusion blocking properties at thicknesses desired for smaller IC technology nodes. For example, though silicon nitride can satisfactorily limit (or prevent) metal diffusion, such as copper diffusion, thicknesses (for example, about 10 nm to about 20 nm) required for silicon nitride to achieve desired metal diffusion blocking functions, and thus avoid void formation at CESL/interconnect interfaces, is too great for 20 nm and below IC technology nodes. In contrast, after undergoing nitrogen plasma treatment, metal nitride can reliably provide desired metal diffusion blocking and etch stop functions at thickness less than or equal to about 3 nm, which thicknesses also seamlessly integrate into 20 nm and below IC technology nodes and minimize contributions of parasitic capacitance by ESLs to MLI features.

Turning to FIG. 2G, processing continues with forming a CESL 260 over CESL 250 and a CESL 262 over CESL 260, thereby forming a multi-layer CESL 265 that includes CESL 250, CESL 260, and CESL 262. An ILD layer 270 is then formed over CESL 265, in particular, on CESL 262. In some embodiments, CESL 260 has a thickness t6 of about 3 nm to about 9 nm, and CESL 262 has a thickness t7 of about 2 nm to about 5 nm. CESL 260 and CESL 262 include materials that are different than ILD layer 270 to achieve etching selectivity during subsequent etching processes, such as those used to form an interconnect opening that exposes copper interconnect 230. In other words, CESL 260 and CESL 262 and their surrounding layers will include materials having distinct etching sensitivities to a given etchant. For example, CESL 260 and CESL 262 includes a material having an etch rate to an etchant that is less than an etch rate of a material of an ILD layer to the etchant so that the material of CESL 260 and/or CESL 262 act as an etch stop during etching of an overlying ILD layer (including, for example, a low-k dielectric material). CESL 260 and CESL 262 also include materials that promote adhesion between CESL 250 and ILD layer 270. In some embodiments, CESL 260 and CESL 262 include materials that are substantially free of nitrogen. For example, CESL 260 and CESL 262 include materials having a nitrogen concentration that is less than about 1 at %. CESL 260 includes oxygen and/or carbon, and in some embodiments, includes silicon. For example, CESL 260 includes SiO, SiC, SiCO, other oxygen and/or carbon comprising material, or combinations thereof. In the depicted embodiment, CESL 260 includes oxygen-doped silicon carbide (SiCO, also referred to as ODC). CESL 262 includes metal and oxygen and thus may be referred to as a metal oxide layer. The metal can include aluminum, hafnium, titanium, copper, manganese, vanadium, other suitable metal, or combinations thereof. In the depicted embodiment, the metal is aluminum, and CESL 262 is an aluminum oxide (AlO) CESL. In some embodiments, CESL 262 includes an aluminum concentration of about 55 at % to about 65 at % and an oxygen concentration of about 35 at % to about 45 at %. CESL 260 and/or CESL 262 are formed by CVD, PVD, ALD, HDPCVD, MOCVD, RPCVD, PECVD, LPCVD, ALCVD, APCVD, PEALD, FCVD, other suitable deposition methods, or combinations thereof. Subsequent to the deposition of CESL 260 and/or CESL 262, a CMP process and/or other planarization process may be performed, such that CESL 260 and/or CESL 262 has a substantially planar surface.

ILD layer 270 is similar to ILD layer 210. For example, ILD layer 270 is formed by a deposition process, such as CVD, PVD, ALD, HDPCVD, MOCVD, RPCVD, PECVD, LPCVD, ALCVD, APCVD, PEALD, FCVD, other suitable deposition methods, or combinations thereof. ILD layer 270 includes a dielectric material including, for example, silicon oxide, carbon doped silicon oxide, silicon nitride, silicon oxynitride, TEOS, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 270 includes a low-k dielectric material. For example, in the depicted embodiment, ILD layer 270 includes an ELK dielectric material, such as silicon dioxide ($SiO_2$) (for example, porous silicon dioxide), silicon carbide (SiC), and/or carbon-doped oxide (for example, SiCOH-based material (having, for example, Si—$CH_3$ bonds)), each of which is tuned/configured to exhibit a dielectric constant less than about 2.5. In some embodiments, ILD layer 270 may include a multilayer structure having multiple dielectric materials. In some embodiments, ILD layer 270 has a thickness t8 of about 60 nm to about 90 nm. Subsequent to the deposition of ILD layer 270, a CMP process and/or other planarization process may be performed, such that ILD layer 270 has a substantially planar surface.

Turning to FIG. 2H, an interconnect opening 280 is formed in ILD layer 270 and CESL 265 (which can collectively be referred to as a dielectric layer) by a patterning process. In the depicted embodiment, interconnect opening 280 extends vertically through ILD layer 270 and CESL 265 to expose copper interconnect 230, in particular, capping layer 240 of copper interconnect 230. Interconnect opening 280 includes a sidewall 282 (defined by ILD layer 270 and CESL 265), a sidewall 284 (defined by ILD layer 270 and CESL 265), and a bottom 286 (defined by copper interconnect 230) that extends between sidewall 282 and sidewall 284. In FIG. 2H, interconnect opening 280 has a trapezoidal shape, though the present disclosure contemplates interconnect opening 280 having other shapes, such as a rectangular shape. Sidewalls of interconnect opening 280 are tapered, such that a width of interconnect opening 280 decreases along a thickness of the dielectric layer and a width of interconnect opening 280 exposing copper interconnect 230 is less than a width of interconnect opening 280 at a top surface of ILD layer 270. The patterning process for forming interconnect opening 280 may be similar to the patterning process used to form interconnect opening 220. For example, the patterning process includes performing a lithography process to form a patterned mask layer 288 (having an opening 289 therein) over ILD layer 270 and performing an etching process to transfer a pattern defined in patterned mask layer 288 to ILD layer 270 and CESL 265. The lithography process can include forming a resist layer on ILD layer 270 (for example, by spin coating), performing a pre-exposure baking process, performing an exposure process using a mask, performing a post-exposure baking process, and performing a developing process. During the exposure process, the resist layer is exposed to radiation energy, where the mask blocks, transmits, and/or reflects radiation to the resist layer depending on a mask pattern of the mask and/or mask type, such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. Alternatively, the exposure process can be implemented or replaced by other methods, such as maskless lithography, electron-beam writing, and/or ion-beam writing. In some embodiments, the patterned resist layer is patterned mask layer 288. In such embodiments, the patterned resist layer is used as an etch mask to remove portions of ILD layer 270 and/or CESL 265 exposed by opening 289, thereby exposing copper interconnect 230. In some embodiments, the patterned resist layer is formed over a mask layer formed over ILD layer 270 before forming the resist layer, and the patterned resist layer is used as an etch mask to remove portions of the mask layer formed ILD layer 270, thereby forming patterned mask layer 288. In such embodiments, the patterned mask layer is used as an etch mask to remove portions of ILD layer 270 and/or CESL 265 exposed by opening 289, thereby exposing copper interconnect 230. In some embodiments, after the etching process, patterned mask layer 288 is removed from over ILD layer 270 (in some embodiments, by a resist stripping process). In some embodiments, patterned mask layer 288 is removed during etching of ILD layer 270, CESL 262, CESL 260, and/or nitrogen-treated CESL 250'.

In some embodiments, the etch process is a multi-step etch process that includes a first etch step that selectively etches ILD 270 and a second etch step that selectively etches CESL 265. For example, the first etch step is configured to remove ILD layer 270 but not remove or substantially remove CESL 265 so that the first etch stops upon reaching CESL 265, while the second etch step is configured to remove CESL 265 but not remove or substantially remove ILD 270 and copper interconnect 230 so that the second etch stops upon reaching copper interconnect 230 (in particular, capping layer 240). Various etch parameters can be tuned to achieve selective etching of ILD layer 270 and CESL 265, such as etchant composition, etch temperature, etch solution concentration, etch time, etch pressure, source power, RF bias voltage, RF bias power, etchant flow rate, other suitable etch parameters, or combinations thereof. For example, for the first etch step, an etchant is selected for the etching process that etches the material of ILD layer 270 (in the depicted embodiment, an ELK material including silicon and oxygen) at a higher rate than the material of CESL 265 (in the depicted embodiment, metal oxide, oxygen-doped silicon carbide, and metal nitride) (i.e., the etchant has a high etch selectivity with respect to the material of ILD layer 270). For the second etch step, an etchant is selected for the etching process that etches the material of CESL 265 at a higher rate than the material of ILD layer 270 (i.e., the etchant has a high etch selectivity with respect to the material of CESL 265). In some embodiments, the first etch step and/or the second etch step may be configured to slightly over etch. In such embodiments, the first etch step may partially etch CESL 265 and/or the second etch step may partially etch capping layer 240. In some embodiments, the second etch step may include multiple steps for selectively etching each layer of CESL 265, such as CESL 262, CESL 260, and nitrogen-treated CESL 250'), where each step is configured to selectively etch a respective one of the layers of CESL 265. The etch process is a dry etching process, a wet etching process, other suitable etching process, or combinations thereof. A dry etching process may implement a hydrogen-comprising etch gas, an oxygen-comprising etch gas, a fluorine-comprising etch gas (for example, $CF_4$, $SF_6$, $CH_2F_2$, $CHF_3$, and/or $C_2F_6$), a chlorine-comprising etch gas (for example, $Cl_2$, $CHCl_3$, $CCl_4$, and/or $BCl_3$), a bromine-comprising etch gas (for example, HBr and/or $CHBr_3$), an iodine-comprising etch gas, other suitable etch gases and/or etch plasmas, or combinations thereof. A wet etching process may implement a wet etchant solution that includes DHF, KOH, $NH_4OH$, $NH_3$, HF, $HNO_3$, $CH_3COOH$, $H_2O$, other suitable wet etchant solution constituents, or combinations thereof. In some embodiments, the first etch step is a dry etching process that utilizes an etch gas that includes $C_4F_8$ and Ar to selectively etch ILD layer 270. In such embodiments, a ratio of $C_4F_8$ to Ar, an etch temperature, and/or an RF power may be tuned to achieve desired etch selectivity. In some embodiments, the first etch step is a wet etching process that utilizes a wet etchant solution that includes HF to selectively etch ILD layer 270. In such embodiments, an etch temperature and/or an etch time may be tuned to achieve desired etch selectivity. In some embodiments, the second etch step is a dry etching process that utilizes an etch gas that includes $Cl_2$, $CHCl_2$, and/or $N_2$ to selectively etch CESL 265. In such embodiments, a ratio of $Cl_2$ to $CHCl_2$ and/or $N_2$, an etch temperature, and/or an RF power may be tuned to achieve desired etch selectively.

Turning to FIG. 2J, an interconnect 290 is formed in interconnect opening 280. Because nitrogen-treated CESL 250' of CESL/copper interface A of portion 200 has a greater surface nitrogen concentration and greater (stronger) nitrogen bonding than a CESL that is not treated with nitrogen, such as CESL 250 in portion 200' depicted in FIG. 3, CESL/copper interface A of portion 200 limits (or prevents) copper diffusion from occurring during BEOL processing that typically leads to an accumulation of copper vacancies at CESL/copper interface A, thereby preventing voids 298, such as depicted in FIG. 3, from forming at CESL/copper interface A. Such phenomena is further illustrated by FIG. 7A and FIG. 7B, where FIG. 7A is a fragmentary diagrammatic top view of copper bulk layer 236 of copper interconnect 230 when nitrogen-treated CESL 250' is formed over copper interconnect 230, and FIG. 7B is a fragmentary diagrammatic top view of copper bulk layer 236 of copper interconnect 230 when CESL 250 (not subjected to a nitrogen plasma treatment) is formed over copper interconnect 230. Without treating the CESL overlying copper interconnect 230 to a nitrogen treatment, copper diffusion that occurs during BEOL processing can lead to an accumulation of copper vacancies and cause voids in copper bulk layer 236 as illustrated in FIG. 7B. In the depicted embodiment, copper interconnect 230 is a via of the MLI feature (in other words, an interconnect that connects two different layers of the MLI feature) and interconnect 290 is a conductive line of the MLI feature. For example, copper interconnect 230 is a via that connects a conductive line of a first metal layer of the MLI feature (e.g., metal one (M1) layer below copper interconnect 230) to interconnect 290 of a second metal layer of the MLI feature (e.g., metal two (M2) layer above copper interconnect 230). In another example, copper interconnect 230 is a via that connects a source/drain contact or a gate of a first metal layer of the MLI feature (e.g., device contact, metal zero (M0) layer below copper interconnect 230) to interconnect 290 of a second metal layer of the MLI feature (e.g., metal one (M1) layer above copper interconnect 230). In some embodiments, interconnect 290 is similar to copper interconnect 230. For example, interconnect 290 can include a diffusion barrier layer 292 (having a first barrier layer 294A and a second barrier layer 294B) and a copper bulk layer 296 disposed over diffusion barrier layer 292. Diffusion barrier layer 292 is disposed on sidewalls 282, 284 and bottom 286 of interconnect opening 280 defined by ILD layer 270, CESL 265, and copper interconnect 230. Diffusion barrier layer 292, first barrier layer 294A, second barrier layer 294B, and copper bulk layer 296 are similar respectively to diffusion barrier layer 232, first barrier layer 234A, second barrier layer 234B, and copper bulk layer 296, all of which are described above. Alternatively, interconnect 290 is configured differently than copper interconnect 230 and includes different layers and/or materials than copper interconnect 230. The present disclosure thus contemplates various material configurations and/or compositions of interconnect 290. Thereafter, fabrication can continue with fabricating additional portions of the MLI feature.

Figure 8:
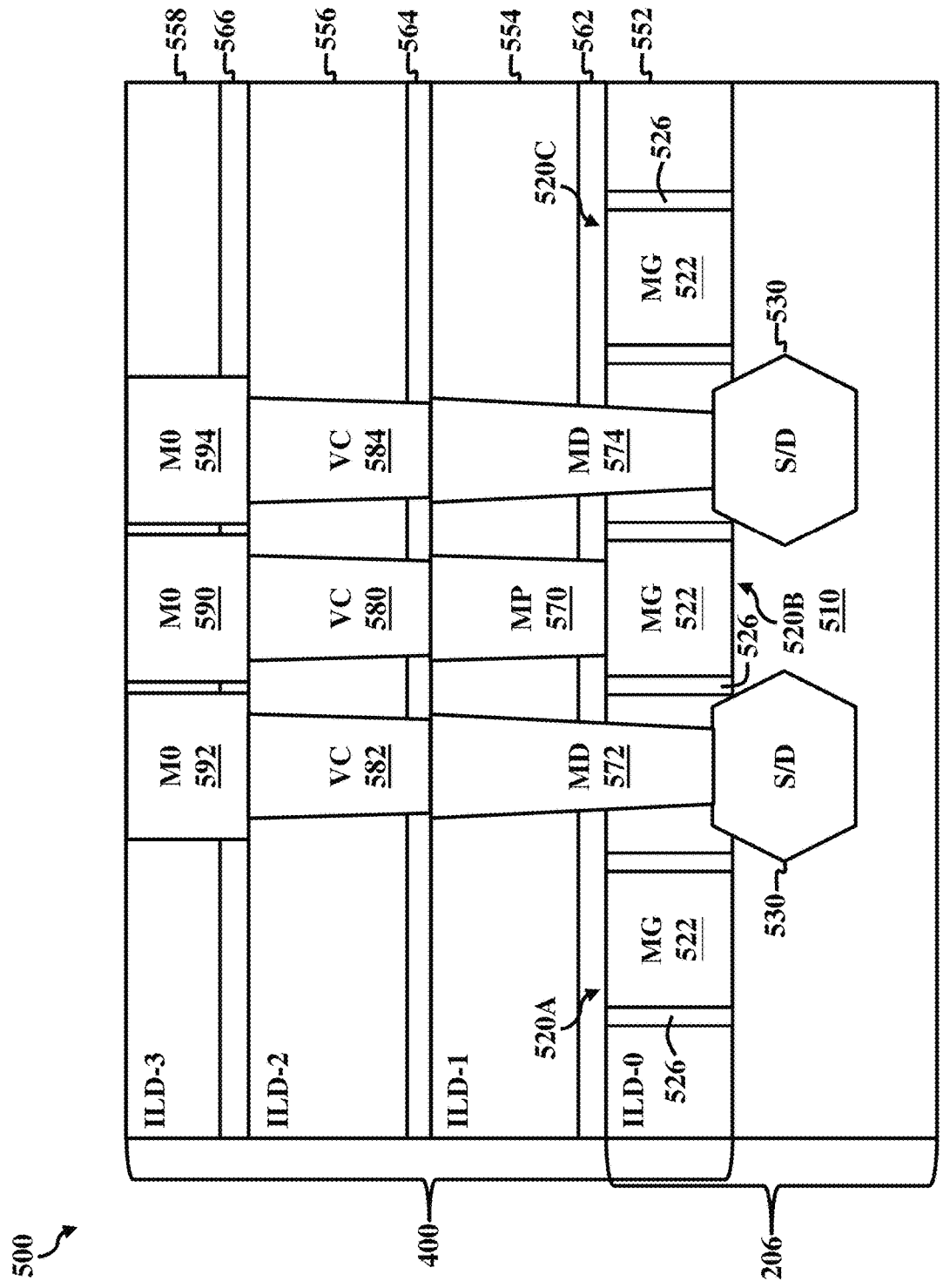
FIG. 8 is a fragmentary diagrammatic view of an integrated circuit device, in portion or entirety, according to various aspects of the present disclosure.

Turning to FIG. 8, FIG. 8 is a fragmentary diagrammatic view of an IC device 500, in portion or entirety, according to various aspects of the present disclosure. IC device 500 may be included in a microprocessor, a memory, and/or other integrated circuit device. In some implementations, IC device 500 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 8 has been simplified for the sake of clarity to better understand the inventive concepts of the present disclosure. Additional features can be added in IC device 500, and some of the features described below can be replaced, modified, or eliminated in other embodiments of IC device 500.

IC device 500 includes device substrate 206, which includes a substrate (wafer) 510. In the depicted embodiment, substrate 510 includes silicon. Alternatively or additionally, substrate 510 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 510 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 510 can include doped regions formed by an ion implantation process, a diffusion process, and/or other suitable doping process depending on design requirements of IC device 500. In some embodiments, substrate 510 includes p-type doped regions (for example, p-type wells) doped with p-type dopants, such as boron, indium, other p-type dopant, or combinations thereof. In some embodiments, substrate 510 includes n-type doped regions (for example, n-type wells) doped with n-type dopants, such as phosphorus, arsenic, other n-type dopant, or combinations thereof. In some embodiments, substrate 510 includes doped regions formed with a combination of p-type dopants and n-type dopants. The various doped regions can be formed directly on and/or in substrate 510, for example, providing a p-well structure, an n-well structure, a dual-well structure, a raised structure, or combinations thereof.

Isolation features can be formed over and/or in substrate 510 to isolate various regions, such as device regions, of IC device 500. For example, isolation features define and electrically isolate active device regions and/or passive device regions from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures. In some embodiments, isolation features are formed by etching a trench (or trenches) in substrate 510 and filling the trench with insulator material (for example, using a CVD process or a spin-on glass process). A CMP process may be performed to remove excessive insulator material and/or planarize a top surface of isolation features. In some embodiments, isolation features can be formed by depositing an insulator material over substrate 510 after forming fin structures (in some embodiments, such that the insulator material layer fills gaps (trenches) between the fin structures) and etching back the insulator material layer. In some embodiments, isolation features include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some embodiments, isolation features include a dielectric layer disposed over a doped liner layer (including, for example, BSG or PSG).

Device substrate 206 further includes various gate structures disposed over substrate 510, such as a gate structure 520A, a gate structure 520B, and a gate structure 520C. Gate structures 520A-520C each engage a respective channel region defined between a respective source region and a respective drain region, such that current can flow between the respective source/drain regions during operation. In some embodiments, gate structures 520A-520C are formed over a fin structure, such that gate structure 520A-520C each wrap a portion of the fin structure and interpose a respective source region and a respective drain region (collectively referred to as source/drain regions) of the fin structure. Gate structures 520A-520C each include a metal gate (MG) stack, such as a metal gate stack 522. Metal gate stacks 522 are formed by deposition processes, lithography processes, etching processes, other suitable processes, or combinations thereof. Metal gate stacks 522 are fabricated according to a gate last process, a gate first process, or a hybrid gate last/gate first process. In gate last process embodiments, gate structures 520A-520C include dummy gate stacks that are subsequently replaced with metal gate stacks 522. The dummy gate stacks include, for example, an interfacial layer (including, for example, silicon oxide) and a dummy gate electrode layer (including, for example, polysilicon). In such embodiments, the dummy gate electrode layer is removed, thereby forming openings (trenches) that are subsequently filled with metal gate stacks 522.

Metal gate stacks 522 are configured to achieve desired functionality according to design requirements of IC device 500. In some embodiments, metal gate stacks 522 include a gate dielectric (for example, a gate dielectric layer) and a gate electrode (for example, a work function layer and a bulk conductive layer). Metal gate stacks 522 may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide (k≈3.9). For example, high-k dielectric material has a dielectric constant greater than about 3.9. In some embodiments, the gate dielectric layer is a high-k dielectric layer. The gate electrode includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof.

Gate structures 520A-520C further include gate spacers 236, which are disposed adjacent to (for example, along sidewalls of) metal gate stacks 522. Gate spacers 236 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 510 and subsequently anisotropically etched to form gate spacers 236. In some embodiments, gate spacers 236 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to metal gate stacks 522. In such embodiments, the various sets of spacers can include materials having different etch rates. For example, a first dielectric layer including silicon and oxygen (for example, silicon oxide) can be deposited over substrate 510 and subsequently anisotropically etched to form a first spacer set adjacent to metal gate stacks 522 (or dummy metal gate stacks, in some embodiments), and a second dielectric layer including silicon and nitrogen (for example, silicon nitride) can be deposited over substrate 510 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 510 before and/or after forming gate spacers 236, depending on design requirements of IC device 500.

Epitaxial source features and epitaxial drain features (referred to as epitaxial source/drain features), such as an epitaxial source/drain features 530, are disposed in source/drain regions of substrate 510. Gate structure 520B interposes epitaxial source/drain features 530, such that a channel region is defined between epitaxial source/drain features 530. In some embodiments, gate structure 520B and epitaxial source/drain features 530 form a portion of a transistor of IC device 500. In some embodiments, a semiconductor material is epitaxially grown on and/or from substrate 510 to form epitaxial source/drain features 530 over source/drain regions of substrate 510. In some embodiments, an etching process is performed on source/drain regions of substrate 510 to form source/drain recesses, where epitaxial source/drain features 530 are grown to fill the source/drain recesses. In some embodiments, where substrate 510 represents a portion of a fin structure, epitaxial source/drain features 530 wrap source/drain regions of the fin structure and/or are disposed in source/drain recesses of the fin structure depending on design requirements of IC device 500. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 510. Epitaxial source/drain features 530 are doped with n-type dopants and/or p-type dopants. In some embodiments, epitaxial source/drain features 530 are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 530 are epitaxial layers including silicon and germanium, where the silicon-and-germanium-compromising epitaxial layers are doped with boron, other p-type dopant, or combinations thereof. In some embodiments, epitaxial source/drain features 530 include materials and/or dopants that achieve desired tensile stress and/or compressive stress in the channel regions. In some embodiments, epitaxial source/drain features 530 are doped during deposition by adding impurities to a source material of the epitaxy process. In some embodiments, epitaxial source/drain features 530 are doped by an ion implantation process subsequent to a deposition process. In some embodiments, annealing processes are performed to activate dopants in epitaxial source/drain features 530 and/or other source/drain regions of IC device 500 (for example, HDD regions and/or LDD regions).

MLI feature 400 is disposed over device substrate 206 and includes one or more ILD layers and/or CESLs. In FIG. 8, MLI feature 400 includes an ILD layer 552 (ILD-0) disposed over substrate 510, an ILD layer 554 (ILD-1) disposed over ILD layer 552, an ILD layer 556 (ILD-2) disposed over ILD layer 554, and an ILD layer 558 (ILD-3) disposed over ILD layer 556. MLI feature 400 furthers a CESL 562 disposed between ILD layer 552 and ILD layer 554, a CESL 564 disposed between ILD layer 554 and ILD layer 556, and a CESL 566 disposed between ILD layer 556 and ILD layer 558. A device-level contact 570, a device-level contact 572, a device-level contact 574, a via 580, a via 582, a via 584, a conductive line 590, a conductive line 592, and a conductive line 594 are disposed in ILD layers 552-558 and CESLs 562-566 to form interconnect structures. One or more of ILD layers 552-558 are configured and fabricated similar to ILD layer 210 and/or ILD layer 270 described in detail above. One or more of CESLs 562-566 are configured and fabricated similar to CESL 265, nitride-treated CESL 250', CESL 260, CESL 262, and/or CESL 212 described in detail above. One or more of device-level contacts 570-574, vias 580-584, and conductive lines 590-594 are configured and fabricated similar to copper interconnect 230 and/or interconnect 290. For example, in some embodiments, vias 580-584 are copper interconnects, such as copper interconnect 230, and CESL 566 is configured similar to CESL 265 and includes nitrogen-treated CESL 250'. Accordingly, void formation is limited and/or prevented at interfaces between vias 580-584 and CESL 566 and/or respective conductive lines 590-594 during fabrication of MLI feature 400. IC device 500, such as a transistor of IC device 500, exhibits improved performance.

Device-level contacts 570-574 (also referred to as local interconnects or local contacts) electrically couple and/or physically couple IC device features to other conductive features of MLI feature 400. For example, device-level contact 570 is a metal-to-poly (MP) contact, which generally refers to a contact to a gate structure, such as a poly gate structure or a metal gate structure. In the depicted embodiment, device-level contact 570 is disposed on gate structure 520B (in particular, metal gate stack 522), such that device-level contact 570 connects gate structure 520B to via 580. In furtherance of the example, device-level contact 572 and device-level contact 574 are metal-to-device (MD) contacts, which generally refer to contacts to a conductive region of IC device 500, such as source/drain regions. For example, device-level contact 572 and device-level contact 574 are disposed on respective epitaxial source/drain features 530, such that device-level contact 572 and device-level contact 574 connect epitaxial source/drain features 530 respectively to via 582 and via 584. Vias 580-584 electrically couple and/or physically couple conductive features of MLI feature 400 to one another. For example, via 580 is disposed on device-level contact 570, such that via 580 connects device-level contact 570 to conductive line 590; via 582 is disposed on device-level contact 572, such that via 582 connects device-level contact 572 to conductive line 592; and via 584 is disposed on device-level contact 574, such that via 584 connects device-level contact 574 to conductive line 594.

The present disclosure provides for many different embodiments. Interconnect structures that exhibit reduced accumulation of copper vacancies along interfaces between CESLs and interconnects, along with methods for fabricating such interconnect structures, are disclosed herein. An exemplary interconnect structure of a multi-layer interconnect feature of an integrated circuit device includes a first interlevel dielectric (ILD) layer, a second ILD layer disposed over the first ILD layer, a first copper interconnect disposed in the first ILD layer, and a second copper interconnect disposed in the second ILD layer. An aluminum nitride contact etch stop layer (CESL) is disposed between a portion of the first copper interconnect and the second ILD layer and between the first ILD layer and the second ILD layer. A surface nitrogen concentration at an interface between the aluminum nitride CESL and the first copper interconnect is greater than or equal to about 20 at %. The second copper interconnect extends through the aluminum nitride CESL to physically contact the first copper interconnect. In some embodiments, a density of the aluminum nitride CESL is about 2.70 g/cm3 to about 2.80 g/cm3. In some embodiments, a dielectric constant of the aluminum nitride CESL is about 7.2 to about 7.4. In some embodiments, the aluminum nitride CESL has a thickness that is less than or equal to about 3 nm. In some embodiments, a nitrogen concentration of the aluminum nitride CESL is about 42 atomic percent (at %) to about 48 at %.

In some embodiments, the first copper interconnect includes a copper bulk layer and a cobalt nitride capping layer disposed between the aluminum nitride CESL and the copper bulk layer. A first nitrogen concentration of the aluminum nitride CESL is greater than a second nitrogen concentration of the cobalt nitride capping layer. In some embodiments, the first copper interconnect further includes a tantalum nitride diffusion barrier layer disposed between the copper bulk layer and the first ILD layer. A third nitrogen concentration of tantalum nitride diffusion barrier layer is greater than the second nitrogen concentration of the cobalt nitride capping layer. In some embodiments, the interconnect structure further includes an oxygen-doped silicon carbide CESL disposed over the aluminum nitride CESL and an aluminum oxide CESL disposed over the oxygen-doped silicon carbide CESL. The second copper interconnect extends through the oxygen-doped silicon carbide CESL and the aluminum oxide CESL.

Another interconnect structure of a multi-layer interconnect feature of an integrated circuit device includes a first interconnect disposed in a dielectric layer. The first interconnect has a copper bulk layer, a first metal nitride layer disposed along sidewalls of the copper bulk layer, and a second metal nitride layer disposed along a top of the copper bulk layer. The first metal nitride layer is disposed between the copper bulk layer and the dielectric layer. The first metal nitride layer includes a first metal and the second metal nitride layer includes a second metal. The interconnect structure further includes a third metal nitride layer disposed over the second metal nitride layer. The third metal nitride layer includes a third metal. The third metal, the second metal, and the first metal are different. The interconnect structure further includes a second interconnect disposed in the dielectric layer and extending through the third metal nitride layer to the first interconnect. In some embodiments, the first metal is tantalum, the second metal is cobalt, and the third metal is aluminum. In some embodiments, the first metal nitride layer has a first nitrogen concentration, the second metal nitride layer has a second nitrogen concentration, and the third metal nitride layer has a third nitrogen concentration. The first nitrogen concentration, the second nitrogen concentration, and the third nitrogen concentration are different. In some embodiments, the third nitrogen concentration is greater than the first nitrogen concentration and the second nitrogen concentration. In some embodiments, the first nitrogen concentration is greater than the second nitrogen concentration. In some embodiments, a density of the third metal nitride layer is about 2.70 g/cm$^3$ to about 2.80 g/cm$^3$. In some embodiments, a dielectric constant of the third metal nitride layer is about 7.2 to about 7.4. In some embodiments, the interconnect structure further includes a metal oxide layer disposed over the third metal nitride layer. The metal oxide layer includes the third metal and the second interconnect further extends through the metal oxide layer. In some embodiments, the first interconnect further has a metal layer disposed between the first metal nitride layer and the dielectric layer, wherein the metal layer includes the second metal.

An exemplary method for fabricating an interconnect structure includes forming a copper interconnect in an interlayer dielectric (ILD) layer and depositing a metal nitride CESL over the copper interconnect and the ILD layer. An interface region between the metal nitride CESL and the copper interconnect has a first nitrogen concentration and/or a first number of nitrogen-nitrogen bonds. The method further includes performing a nitrogen plasma treatment to modify the interface region between the metal nitride CESL and the copper interconnect. The nitrogen plasma treatment increases the first nitrogen concentration to a second nitrogen concentration and/or the first number of nitrogen-nitrogen bonds to a second number of nitrogen-nitrogen bonds, both of which minimize accumulation of copper vacancies in the interface region.

An exemplary method includes forming an interconnect opening in a first dielectric layer to expose an underlying conductive feature. The interconnect opening has first sidewalls defined by the first dielectric layer and a first bottom defined by the underlying conductive feature. The method further includes forming a first metal interconnect in the interconnect opening, which includes forming a diffusion barrier layer along the first sidewalls defined by the first dielectric layer and the first bottom defined by the underlying conductive feature, forming a metal bulk layer over the diffusion barrier layer, and forming a metal nitride capping layer over the metal bulk layer. The diffusion barrier layer partially fills the interconnect opening and the metal bulk layer fills a remainder of the interconnect opening. The method further includes performing a deposition process to form a metal nitride etch stop layer (ESL) over the first metal interconnect and the first dielectric layer. An interface is defined between the metal nitride ESL and the metal nitride capping layer of the first metal interconnect. The method further includes performing a nitrogen plasma treatment on the metal nitride ESL to increase nitrogen-nitrogen bonding along the interface defined between the metal nitride ESL and the metal nitride capping layer of the first metal interconnect. The method further includes forming a second dielectric layer over the metal nitride ESL and forming a second interconnect opening in the second dielectric layer to expose the first metal interconnect. The second interconnect opening has second sidewalls defined by the second dielectric layer and the metal nitride ESL and a second bottom defined by the first metal interconnect. The method further includes forming a second metal interconnect in the second interconnect opening.

In some embodiments, the metal nitride ESL includes aluminum, the method further comprising tuning parameters of the nitrogen plasma treatment to increase a number of Al—N bonds in the metal nitride ESL along the interface. In some embodiments, the metal nitride capping layer includes cobalt, and the method further includes tuning parameters of the nitrogen plasma treatment to increase a number of Co—N bonds in the metal nitride capping layer along the interface. In some embodiments, performing the nitrogen plasma treatment includes generating an N$_2$ plasma. In some embodiments, the metal bulk layer includes a first metal, the metal nitride capping layer includes a second metal, and the metal nitride ESL includes a third metal, where the first metal, the second metal, and the third metal are different. In some embodiments, the diffusion barrier layer includes a metal nitride diffusion barrier layer that includes a fourth metal. The fourth metal is different than the first metal, the second metal, and the third metal, in some embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnect structure, the method comprising:
    forming a first interconnect in a first dielectric layer, wherein the first interconnect includes a copper bulk layer;
    after forming the first interconnect, forming a metal nitride cap over the first interconnect;
    after forming the metal nitride cap, forming a metal nitride etch stop layer over the metal nitride cap, the first interconnect, and the first dielectric layer;
    performing a nitrogen plasma treatment on the metal nitride etch stop layer;

after performing the nitrogen plasma treatment, forming a second dielectric layer over the metal nitride etch stop layer; and forming a second interconnect in the second dielectric layer and the metal nitride etch stop layer, wherein the second interconnect extends through the second dielectric layer and the metal nitride etch stop layer to the first interconnect.

2. The method for forming the interconnect structure of claim 1, further comprising tuning parameters of the nitrogen plasma treatment to increase a nitrogen concentration at an interface region of the metal nitride etch stop layer and the first interconnect.

3. The method for forming the interconnect structure of claim 1, wherein the nitrogen plasma treatment is a first nitrogen plasma treatment and the forming the metal nitride cap layer over the first interconnect includes depositing a metal layer over the first interconnect and performing a second nitrogen plasma treatment on the metal layer.

4. The method for forming the interconnect structure of claim 1, wherein the metal nitride cap layer includes a first metal and the metal nitride etch stop layer includes a second metal that is different than the first metal.

5. The method for forming the interconnect structure of claim 1, wherein before the forming of the second dielectric layer, the method further comprises:

forming an oxide layer over the metal nitride etch stop layer; and forming a metal oxide layer over the oxide layer, wherein the second dielectric layer is formed over the metal oxide layer and the second interconnect is further formed in and extends through the metal oxide layer and the oxide layer.

6. The method for forming the interconnect structure of claim 5, wherein the metal oxide layer and the metal nitride etch stop layer include a same metal.

7. The method for forming the interconnect structure of claim 1, wherein the bulk copper layer is a first bulk copper layer and the second interconnect includes a second bulk copper layer.

8. The method for forming the interconnect structure of claim 1, wherein the performing the nitrogen plasma treatment includes exposing the metal nitride etch stop layer to a nitrogen-containing plasma having a nitrogen concentration that is greater than about 50% for about 20 seconds to about 30 seconds.

9. A method for forming an interconnect structure, the method comprising:

forming a first interconnect opening in a first dielectric layer, wherein the first interconnect opening exposes an underlying conductive feature;

forming a first interconnect in the first interconnect opening, wherein the forming the first interconnect includes:

forming a first metal nitride layer in the first interconnect opening, forming a copper bulk layer in the first interconnect opening over the first metal nitride layer, wherein the first metal nitride layer is disposed between the copper bulk layer and the first dielectric layer, and forming a second metal nitride layer over a top of the copper bulk layer and the first metal nitride layer, wherein the first metal nitride layer includes a first metal and the second metal nitride layer includes a second metal;

forming a third metal nitride layer over the second metal nitride layer, wherein the third metal nitride layer includes a third metal and further wherein the third metal, the second metal, and the first metal are different;

forming a metal oxide layer over the third metal nitride layer, wherein the metal oxide layer includes the third metal;

forming a second dielectric layer over the metal oxide layer;

forming a second interconnect opening in the second dielectric layer, the metal oxide layer, and the third metal nitride layer, wherein the second interconnect opening exposes the first interconnect; and forming a second interconnect in the second interconnect opening.

10. The method for forming the interconnect structure of claim 9, wherein the first metal is tantalum, the second metal is cobalt, and the third metal is aluminum.

11. The method for forming the interconnect structure of claim 9, wherein the forming the third metal nitride layer includes:

performing an atomic layer deposition process; and performing a nitrogen plasma treatment.

12. The method for forming the interconnect structure of claim 11, wherein:

the performing the atomic layer deposition process includes performing at least one process cycle that includes a metal-containing pulse, a purge process, and a nitrogen-containing pulse that implements a first nitrogen-containing precursor; and the performing the nitrogen plasma treatment includes performing at least one treatment cycle that includes a nitrogen-containing pulse that implements a second nitrogen-containing precursor and a purge process.

13. The method for forming the interconnect structure of claim 12, wherein the first nitrogen-containing precursor is different than the second nitrogen-containing precursor.

14. The method for forming the interconnect structure of claim 9, further comprising forming an oxygen-doped silicon carbide layer over the third metal nitride layer before forming the metal oxide layer, wherein the second interconnect opening is further formed in the oxygen-doped silicon carbide layer.

15. The method for forming the interconnect structure of claim 9, wherein the copper bulk layer is a first copper bulk layer and the forming the second interconnect in the second interconnect opening includes:

forming a fourth metal nitride layer in the second interconnect opening; and forming a second copper bulk layer in the second interconnect opening over the fourth metal nitride layer, wherein the fourth metal nitride layer is disposed between the second copper bulk layer and the second dielectric layer.

16. The method for forming the interconnect structure of claim 9, wherein the forming the first interconnect further includes forming a metal layer over the first metal nitride layer before forming the copper bulk layer.

17. An interconnect structure comprising:

a first dielectric layer;

a second dielectric layer disposed over the first dielectric layer;

an etch stop layer structure disposed between and separating the first dielectric layer and the second dielectric layer, wherein the etch stop layer structure includes aluminum, nitrogen, oxygen, and carbon;

a first copper layer disposed in the first dielectric layer, wherein the etch stop layer structure is further disposed between the second dielectric layer and the first copper layer, wherein the etch stop layer structure has a first thickness between the first dielectric layer and the second dielectric layer and a second thickness between the second dielectric layer and the first copper layer, wherein the first thickness is greater than the second thickness;

a second copper layer disposed in the second dielectric layer and the etch stop layer structure, wherein the second copper layer is connected to the first copper layer; and an interface region between the first copper layer and the second copper layer, wherein the interface region includes aluminum, nitrogen, and copper.

18. The interconnect structure of claim 17, wherein the interface region between the first copper layer and the second copper layer further includes cobalt.

19. The interconnect structure of claim 17, further comprising:

a first barrier layer disposed between the first copper layer and the first dielectric layer, wherein the first barrier layer includes a metal and nitrogen; and a second barrier layer disposed between the second copper layer and the second dielectric layer, wherein the second barrier layer includes the metal and nitrogen and the metal is different than aluminum.

20. The interconnect structure of claim 17, wherein the interface region between the first copper layer and the second copper layer includes the first copper layer, the second copper layer, and a first metal nitride layer and a second metal nitride layer between a top of the first copper layer and a bottom of the second copper layer, wherein the first metal nitride layer includes a first metal, the second metal nitride layer includes a second metal, and the first metal is different than the second metal.

* * * * *